(12) United States Patent
Yang et al.

(10) Patent No.: US 11,670,618 B2
(45) Date of Patent: *Jun. 6, 2023

(54) SYSTEM-IN-PACKAGE WITH DOUBLE-SIDED MOLDING

(71) Applicant: STATS ChipPAC Pte. Ltd., Singapore (SG)

(72) Inventors: DeokKyung Yang, Incheon Si (KR); YongMin Kim, Incheon-si (KR); JaeHyuk Choi, Incheon (KR); YeoChan Ko, Incheon (KR); HeeSoo Lee, Kyunggi-do (KR)

(73) Assignee: STATS ChipPAC Pte. Ltd., Singapore (SG)

(*) Notice: Subject to any disclaimer, the term of this patent is extended or adjusted under 35 U.S.C. 154(b) by 387 days.

This patent is subject to a terminal disclaimer.

(21) Appl. No.: 17/008,918

(22) Filed: Sep. 1, 2020

(65) Prior Publication Data

US 2020/0402955 A1 Dec. 24, 2020

Related U.S. Application Data

(63) Continuation of application No. 16/826,169, filed on Mar. 21, 2020, now Pat. No. 10,797,024, which is a
(Continued)

(51) Int. Cl.
*H01L 25/065* (2023.01)
*H01L 21/56* (2006.01)
(Continued)

(52) U.S. Cl.
CPC .......... *H01L 25/0655* (2013.01); *H01L 21/56* (2013.01); *H01L 21/561* (2013.01);
(Continued)

(58) Field of Classification Search
CPC ... H01L 21/561; H01L 21/565; H01L 21/566; H01L 21/6835; H01L 23/3121;
(Continued)

(56) References Cited

U.S. PATENT DOCUMENTS 6,287,503 B1 9/2001 Thummel
8,039,304 B2 10/2011 Pagaila
(Continued)

FOREIGN PATENT DOCUMENTS

TW 201225761 A1 6/2012

*Primary Examiner* — Brook Kebede
(74) *Attorney, Agent, or Firm* — Brian M. Kaufman; Robert D. Atkins; Patent Law Group: Atkins and Associates, P.C.

(57) ABSTRACT

A semiconductor device includes a substrate with an opening formed through the substrate. A first electronic component is disposed over the substrate outside a footprint of the first opening. A second electronic component is disposed over the substrate opposite the first electrical component. A third electronic component is disposed over the substrate adjacent to the first electronic component. The substrate is disposed in a mold including a second opening of the mold over a first side of the substrate. The mold contacts the substrate between the first electronic component and the third electronic component. An encapsulant is deposited into the second opening. The encapsulant flows through the first opening to cover a second side of the substrate. In some embodiments, a mold film is disposed in the mold, and an interconnect structure on the substrate is embedded in the mold film.

25 Claims, 20 Drawing Sheets

Related U.S. Application Data continuation of application No. 15/458,649, filed on Mar. 14, 2017, now Pat. No. 10,636,765.

(51) Int. Cl.
| | | |
|---|---|---|
| *H01L 25/00* | (2006.01) | |
| *H01L 23/552* | (2006.01) | |
| *H01L 21/683* | (2006.01) | |
| *H01L 23/31* | (2006.01) | |
| *H01L 25/16* | (2023.01) | |
| H01L 23/00 | (2006.01) | |
| H01L 21/66 | (2006.01) | |
| H01L 23/538 | (2006.01) | |
| H01L 21/48 | (2006.01) | |
| H01L 23/498 | (2006.01) | |
| H01L 23/50 | (2006.01) | |

(52) U.S. Cl.
CPC .......... *H01L 21/565* (2013.01); *H01L 21/566* (2013.01); *H01L 21/6835* (2013.01); *H01L 23/3121* (2013.01); *H01L 23/552* (2013.01); *H01L 25/0652* (2013.01); *H01L 25/16* (2013.01); *H01L 25/50* (2013.01); *H01L 21/486* (2013.01); *H01L 22/14* (2013.01); *H01L 23/3128* (2013.01); *H01L 23/49816* (2013.01); *H01L 23/50* (2013.01); *H01L 23/5384* (2013.01); *H01L 24/05* (2013.01); *H01L 24/11* (2013.01); *H01L 24/13* (2013.01); *H01L 24/81* (2013.01); *H01L 24/94* (2013.01); *H01L 2221/68331* (2013.01); *H01L 2221/68345* (2013.01); *H01L 2221/68359* (2013.01); *H01L 2221/68381* (2013.01); *H01L 2224/0345* (2013.01); *H01L 2224/03452* (2013.01); *H01L 2224/03462* (2013.01); *H01L 2224/03464* (2013.01); *H01L 2224/0401* (2013.01); *H01L 2224/05111* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/1132* (2013.01); *H01L 2224/1145* (2013.01); *H01L 2224/11334* (2013.01); *H01L 2224/11462* (2013.01); *H01L 2224/11464* (2013.01); *H01L 2224/11849* (2013.01); *H01L 2224/11901* (2013.01); *H01L 2224/131* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16113* (2013.01); *H01L 2224/16227* (2013.01); *H01L 2224/32225* (2013.01); *H01L 2224/73204* (2013.01); *H01L 2224/81005* (2013.01); *H01L 2224/81191* (2013.01); *H01L 2224/81192* (2013.01); *H01L 2224/81201* (2013.01); *H01L 2224/81203* (2013.01); *H01L 2224/81411* (2013.01); *H01L 2224/81424* (2013.01); *H01L 2224/81439* (2013.01); *H01L 2224/81444* (2013.01); *H01L 2224/81447* (2013.01); *H01L 2224/81455* (2013.01); *H01L 2224/81466* (2013.01); *H01L 2224/81484* (2013.01); *H01L 2224/81815* (2013.01); *H01L 2224/92125* (2013.01); *H01L 2224/94* (2013.01); *H01L 2224/97* (2013.01); *H01L 2225/06517* (2013.01); *H01L 2225/06537* (2013.01); *H01L 2225/06572* (2013.01); *H01L 2924/0105* (2013.01); *H01L 2924/01013* (2013.01); *H01L 2924/01022* (2013.01); *H01L 2924/01028* (2013.01); *H01L 2924/01029* (2013.01); *H01L 2924/01047* (2013.01); *H01L 2924/01074* (2013.01); *H01L 2924/01079* (2013.01); *H01L 2924/15311* (2013.01); *H01L 2924/15312* (2013.01); *H01L 2924/18161* (2013.01); *H01L 2924/19041* (2013.01); *H01L 2924/19042* (2013.01); *H01L 2924/19043* (2013.01); *H01L 2924/19105* (2013.01); *H01L 2924/19106* (2013.01); *H01L 2924/3025* (2013.01)

(58) Field of Classification Search
CPC ............... H01L 23/552; H01L 25/0652; H01L 25/0655; H01L 25/16; H01L 25/50
See application file for complete search history.

(56) References Cited

U.S. PATENT DOCUMENTS

| | | | |
|---|---|---|---|
| 9,076,802 | B1 | 7/2015 | Ko et al. |
| 10,636,765 | B2* | 4/2020 | Yang ................. H01L 25/50 |
| 10,797,024 | B2* | 10/2020 | Yang ................. H01L 25/16 |
| 2004/0101631 | A1 | 5/2004 | Uragami et al. |
| 2008/0061410 | A1 | 3/2008 | Imaizumi et al. |
| 2008/0112139 | A1 | 5/2008 | Vinciarelli et al. |
| 2009/0302329 | A1* | 12/2009 | Noma ................. H01L 24/05 |
| | | | 257/E33.056 |
| 2011/0068459 | A1* | 3/2011 | Pagaila ............... H01L 24/92 |
| | | | 257/E23.141 |
| 2012/0187568 | A1 | 7/2012 | Lin et al. |
| 2012/0228749 | A1 | 9/2012 | Pagaila |
| 2013/0037936 | A1* | 2/2013 | Choi ............... H01L 23/49833 |
| | | | 257/737 |
| 2014/0353838 | A1 | 12/2014 | Lin et al. |
| 2015/0296667 | A1 | 10/2015 | Hirose et al. |

* cited by examiner

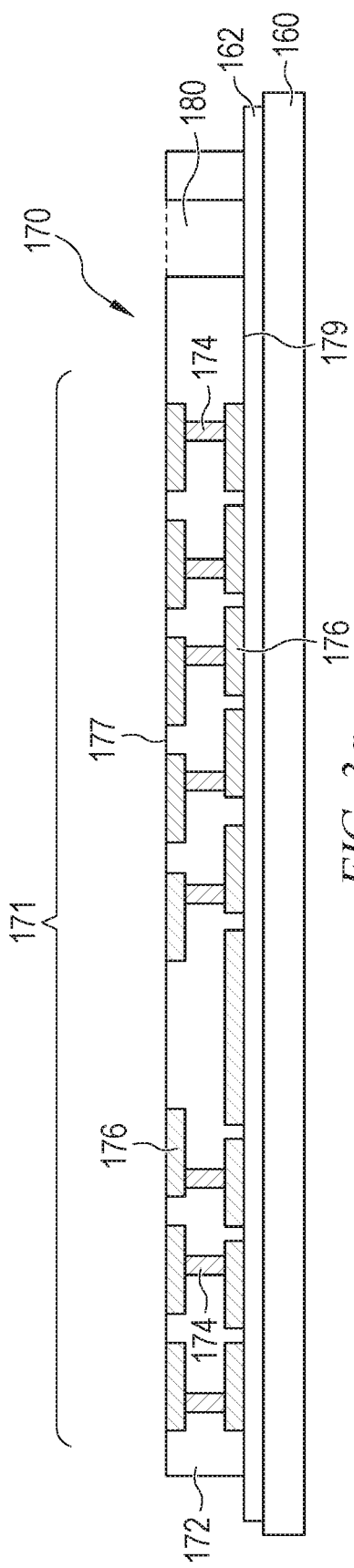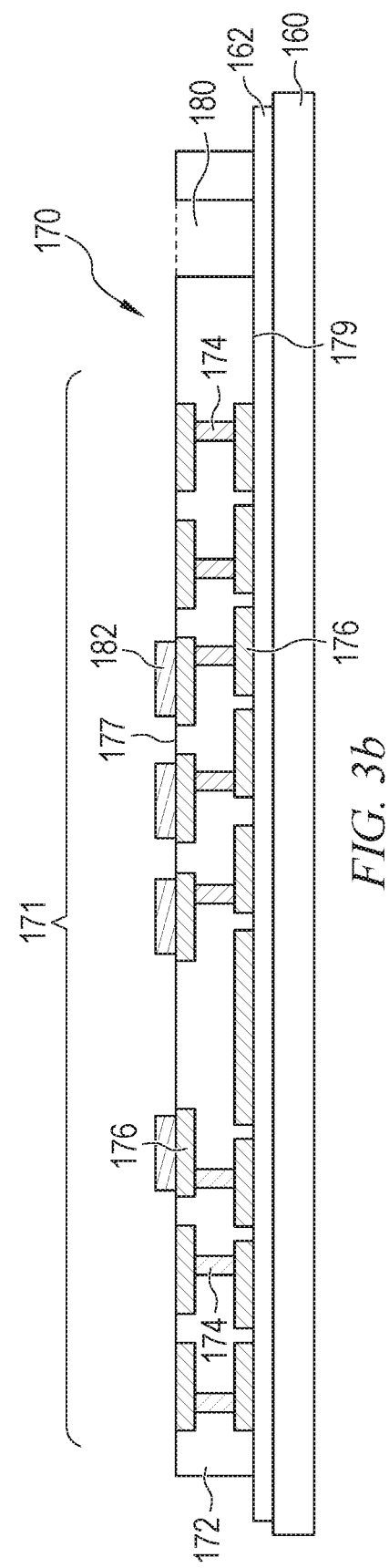

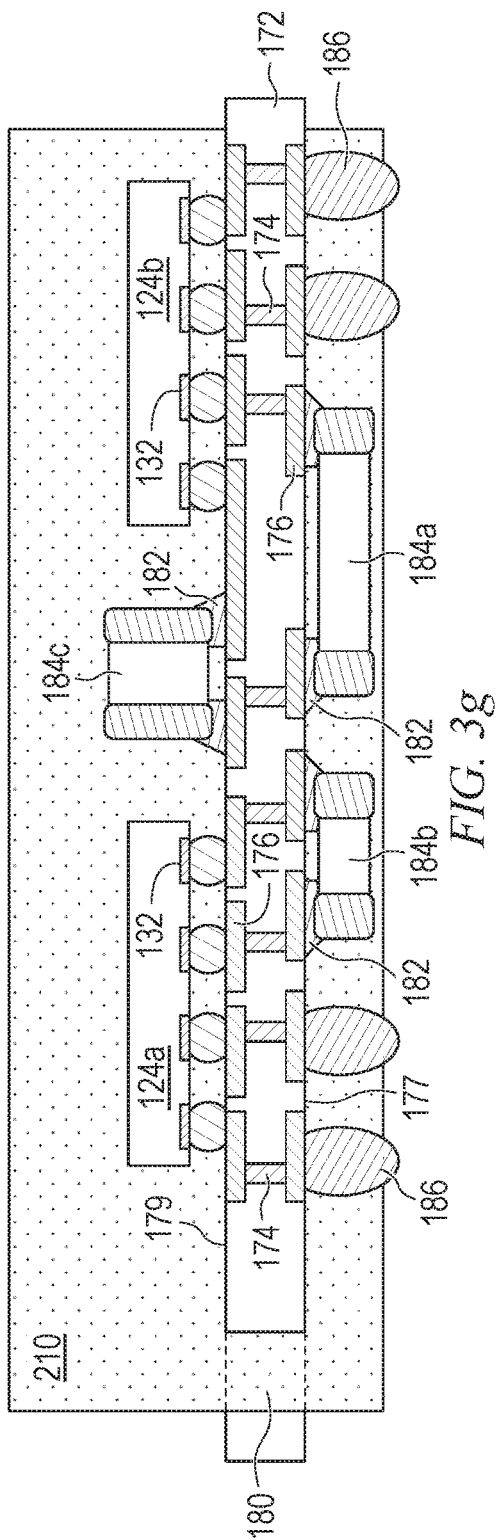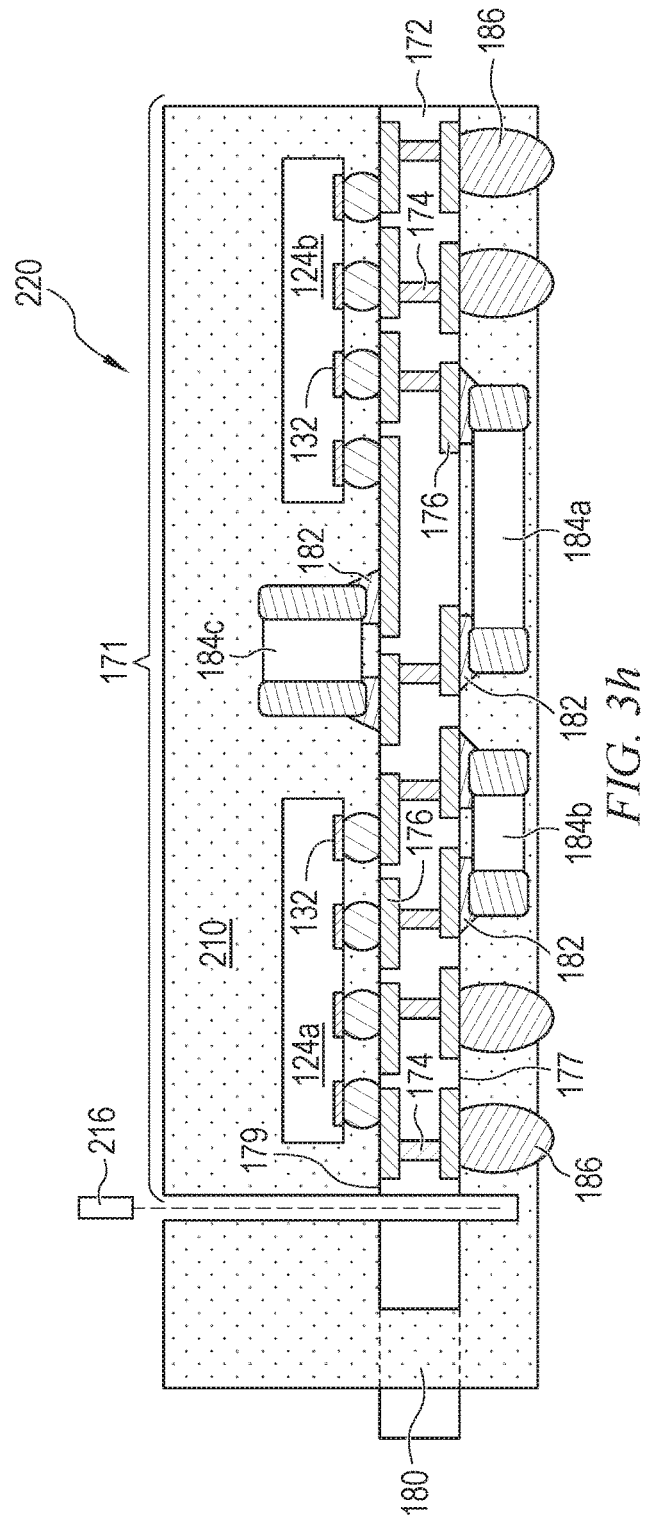

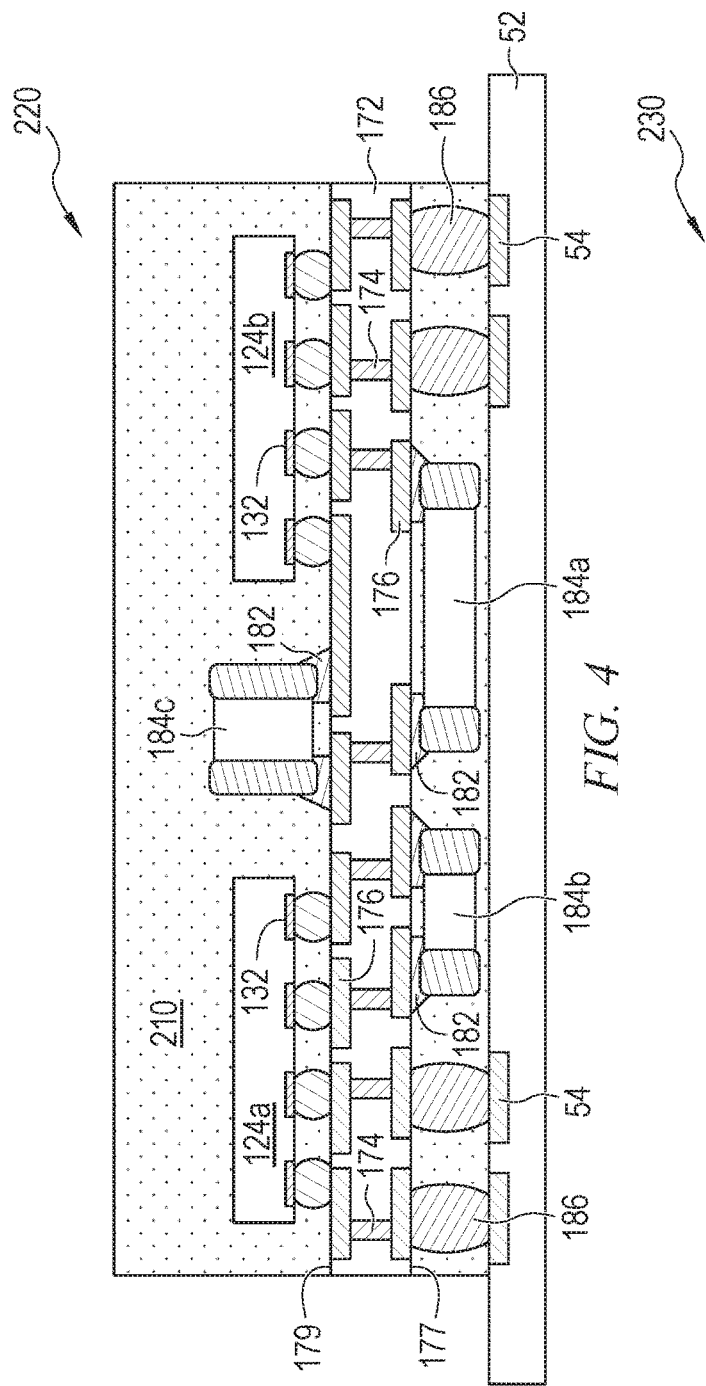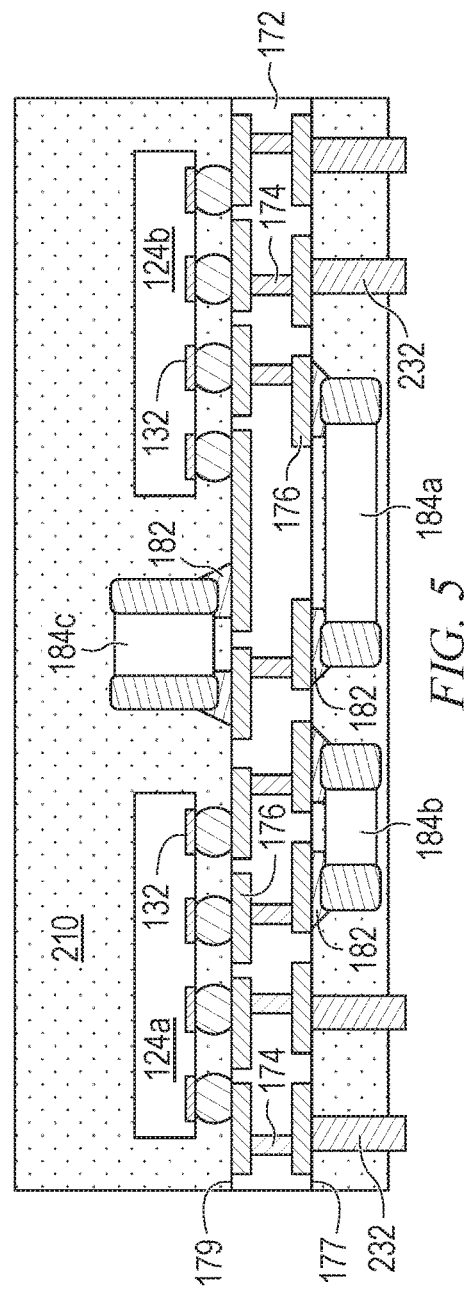

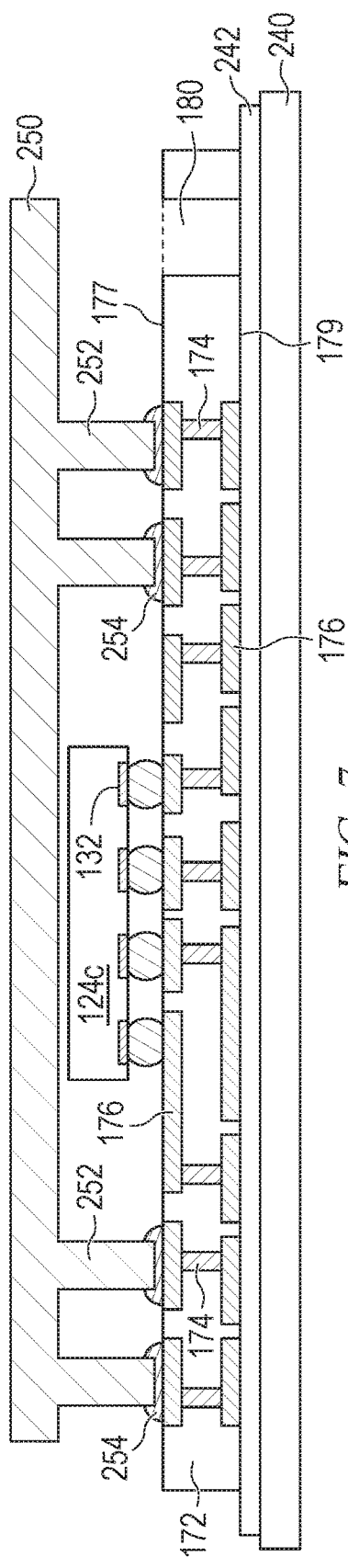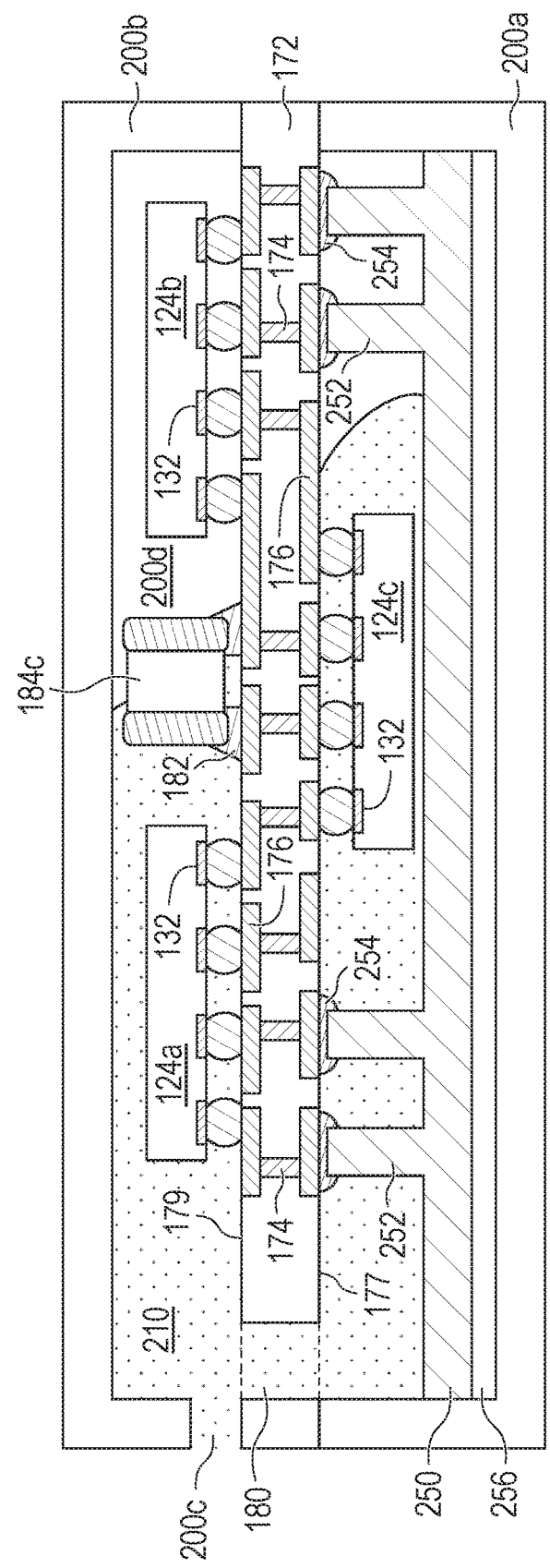
FIG. 7a
FIG. 7b

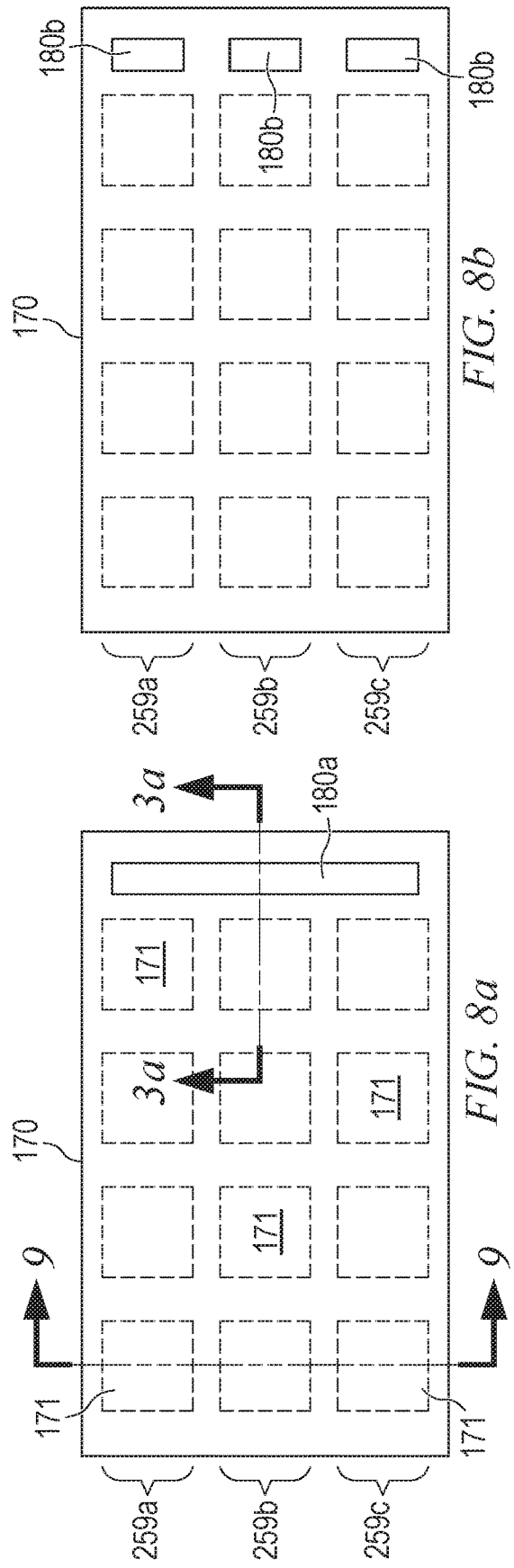
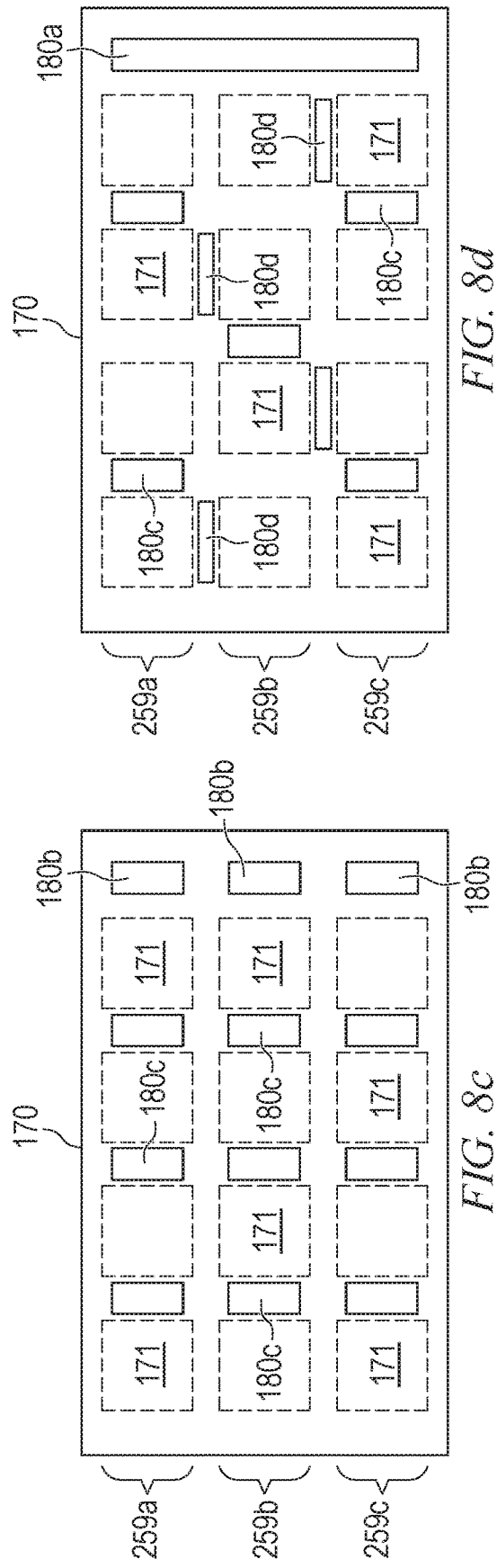

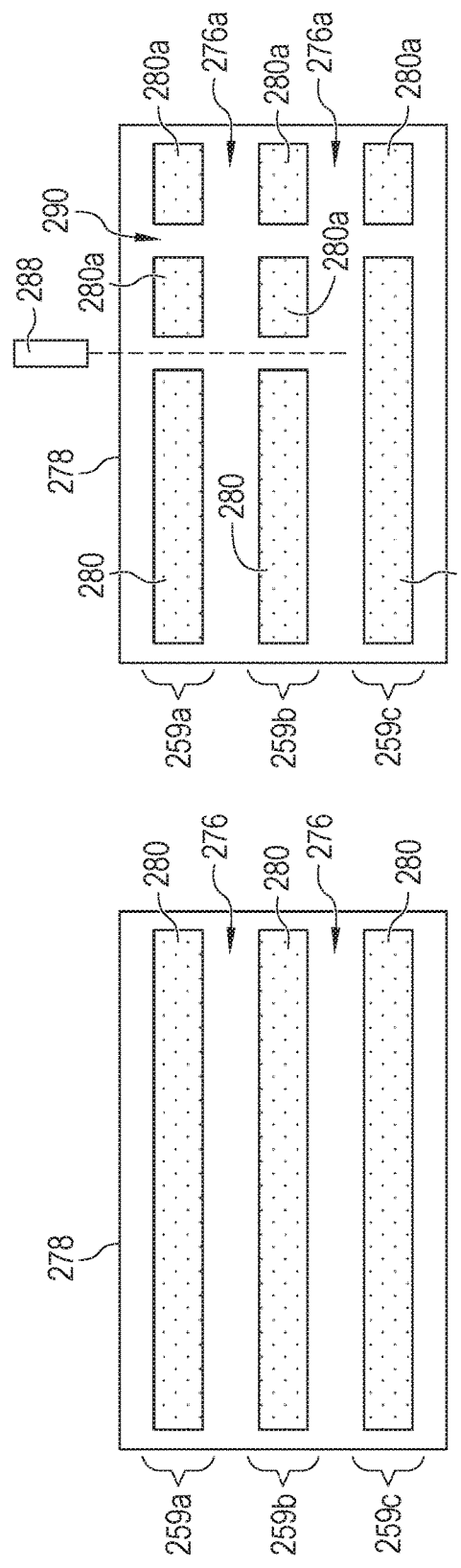
FIG. 13a
FIG. 13b
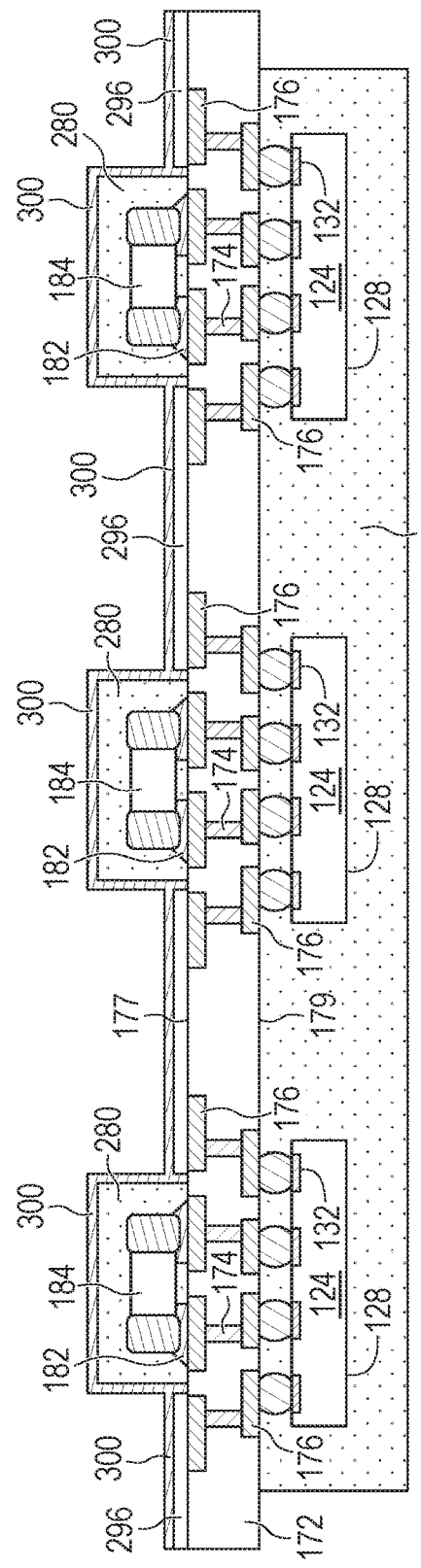
FIG. 13c

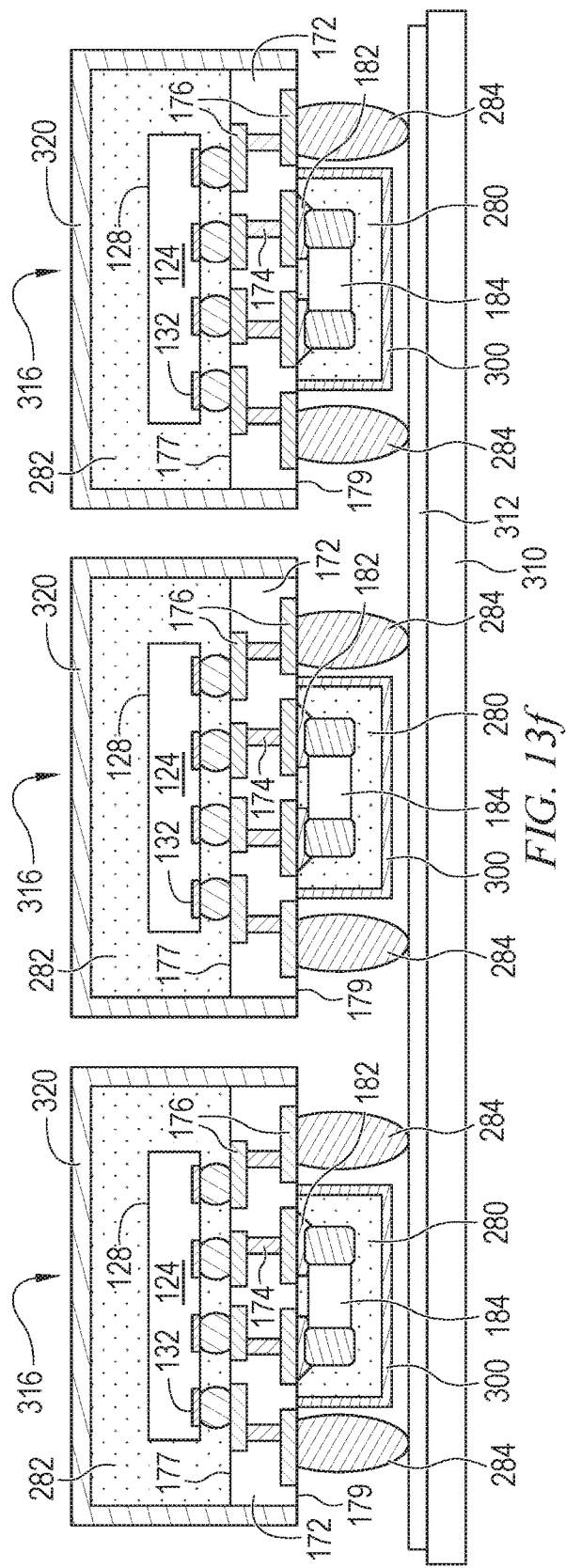
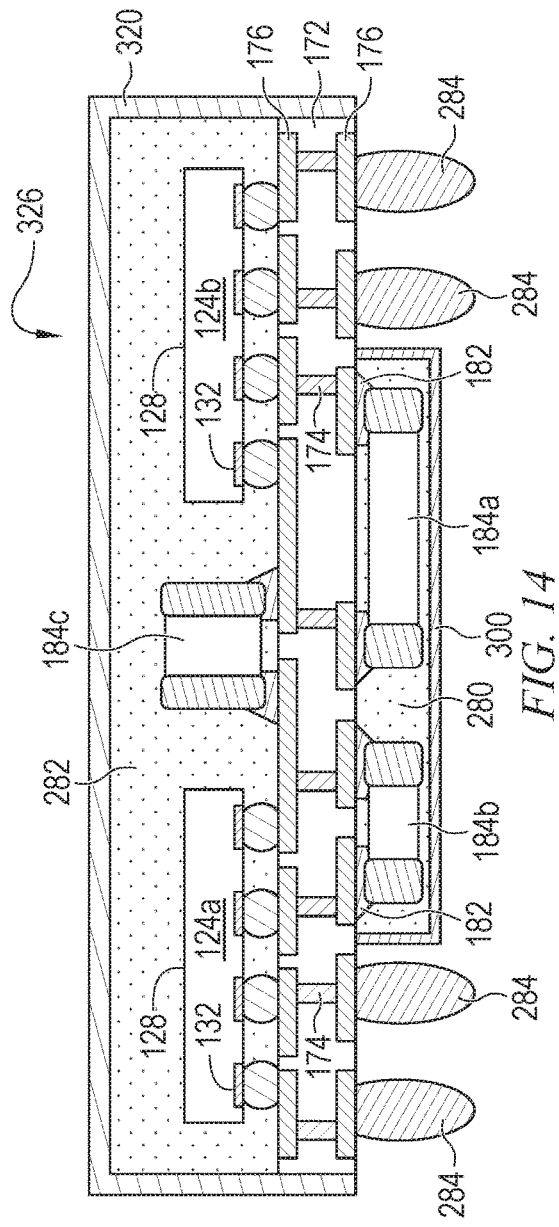

SYSTEM-IN-PACKAGE WITH DOUBLE-SIDED MOLDING

CLAIM TO DOMESTIC PRIORITY

The present application is a continuation of U.S. patent application Ser. No. 16/826,169, now U.S. Pat. No. 10,797,024, filed Mar. 21, 2020, which is a continuation of U.S. patent application Ser. No. 15/458,649, now U.S. Pat. No. 10,636,765, filed Mar. 14, 2017, which applications are incorporated herein by reference.

FIELD OF THE INVENTION

The present invention relates in general to semiconductor devices and, more particularly, to system-in-package devices with double-sided molding.

BACKGROUND OF THE INVENTION

Semiconductor devices are commonly found in modern electronic products. Semiconductor devices vary in the number and density of electrical components. Discrete semiconductor devices generally contain one type of electrical component, e.g., a single light emitting diode (LED), small signal transistor, resistor, capacitor, inductor, or power metal-oxide semiconductor field-effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices or mechanical systems, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Manufacturers also desire to simplify formation of complex package types, or to perform steps required for advanced packages in a simpler manner using existing equipment. Simplifying the packaging process, and using existing equipment, allows advanced semiconductor packages to be formed at a lower cost, thus saving money for the manufacturer, and ultimately the consumer of an end product. One challenge with double-sided molding is the need for two different molds, and the additional capital expenditures required to set up the double molding process.

Therefore, a need exists for a simpler and more cost-effective double-sided molding process.

BRIEF DESCRIPTION OF THE DRAWINGS

FIGS. 3a-3h illustrate a process of forming a system-in-package (SIP) device with double-sided molding in a single molding step;

FIG. 4 illustrates a SIP device with double-sided molding mounted to a PCB;

FIG. 5 illustrates a SIP device with double-sided molding utilizing conductive pillars;

FIGS. 7a-7c illustrate double-sided molding using a leadframe;

FIGS. 8a-8d illustrate PCBs with openings to allow encapsulant to flow between top and bottom sides of the PCB within a mold;

FIGS. 13a-13f illustrate the double-sided molding with bottom-side finger molding with the addition of top and bottom shielding layers; and FIG. 14 illustrates another SIP device having double-sided molding with bottom-side finger molding and shielding layers.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 1:
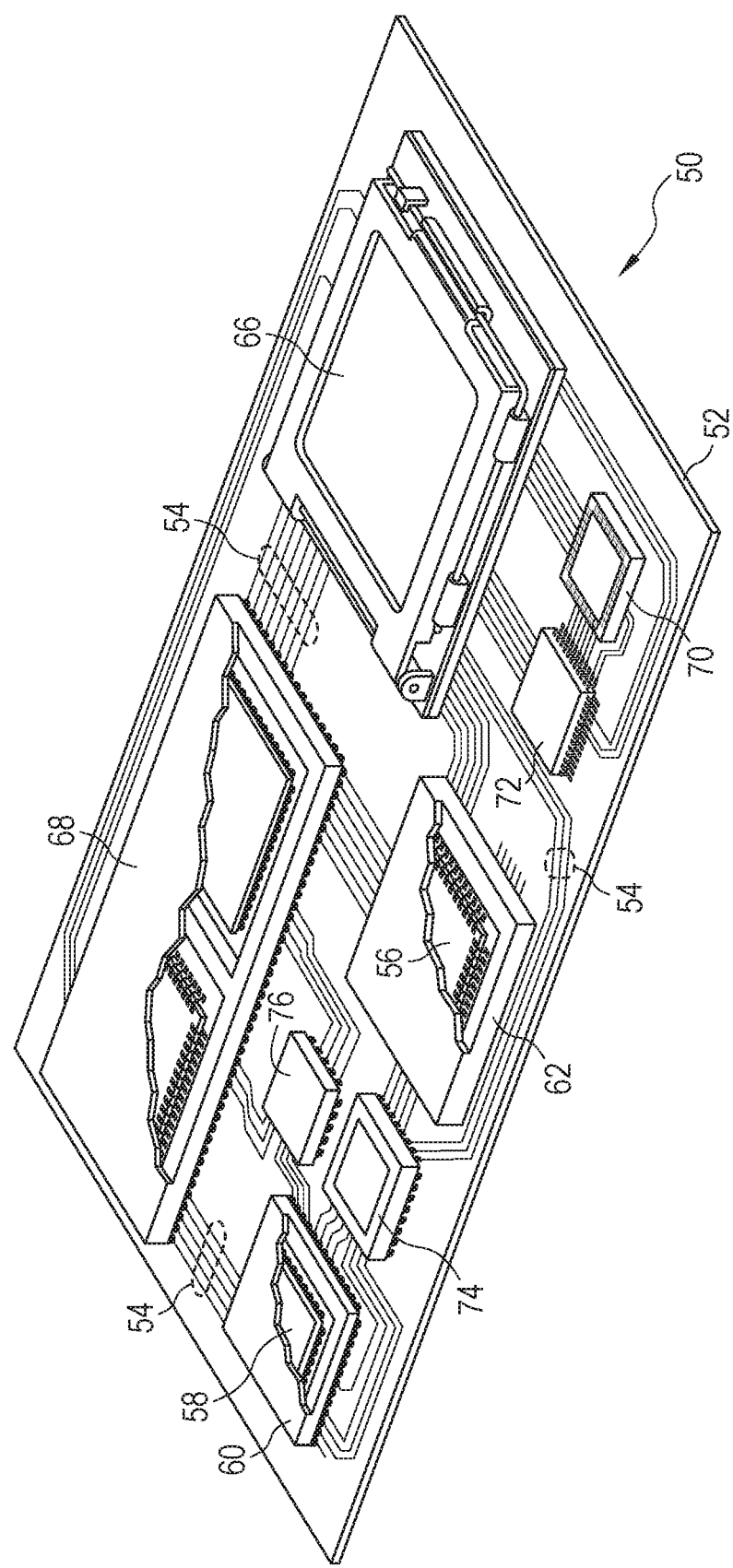
FIG. 1 illustrates a printed circuit board (PCB) with various types of packages mounted to a surface of the PCB.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. Different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power, ground, and clock signal connections to each of the semiconductor packages as needed.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. In one embodiment, eWLB 74 is a fan-out wafer level package (Fo-WLP) and WLCSP 76 is a fan-in wafer level package (Fi-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages.

By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
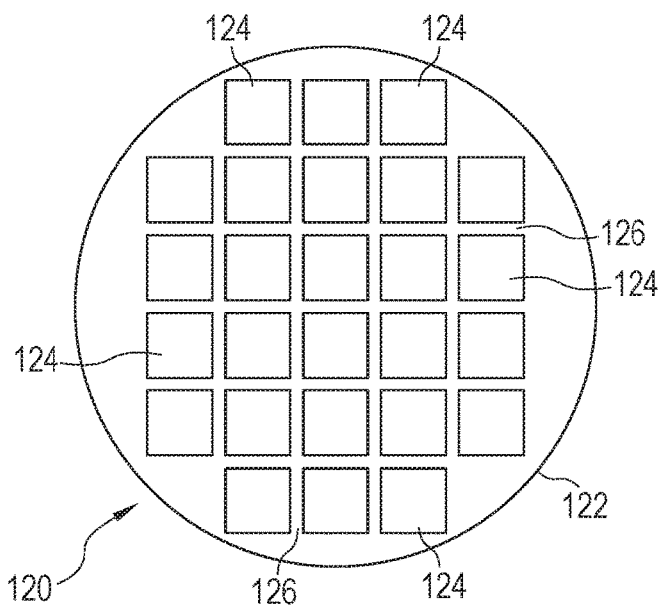
FIGS. 2a-2e illustrate a semiconductor wafer with a plurality of semiconductor die separated by a saw street.

FIG. 2a shows a semiconductor wafer 120 with a base substrate material 122, such as silicon, germanium, aluminum phosphide, aluminum arsenide, gallium arsenide, gallium nitride, indium phosphide, silicon carbide, or other bulk semiconductor material for structural support. A plurality of semiconductor die or components 124 is formed on wafer 120 separated by a non-active, inter-die wafer area or saw street 126. Saw street 126 provides cutting areas to singulate semiconductor wafer 120 into individual semiconductor die 124. In one embodiment, semiconductor wafer 120 has a width or diameter of 100-450 millimeters (mm).

Figure 2B:
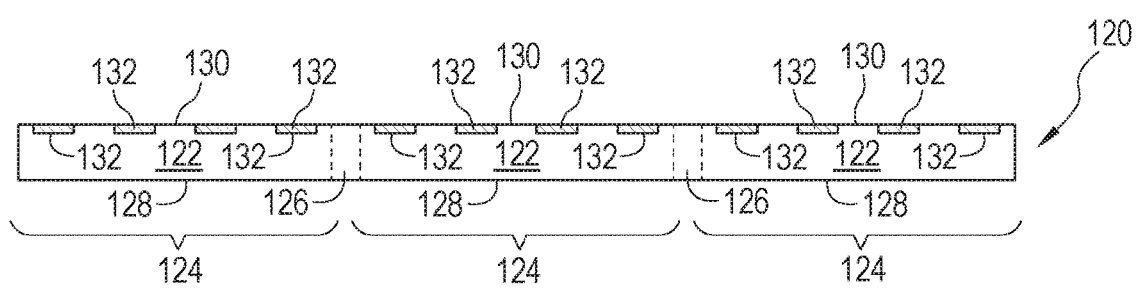

FIG. 2b shows a cross-sectional view of a portion of semiconductor wafer 120. Each semiconductor die 124 has a back or non-active surface 128 and an active surface 130 containing analog or digital circuits implemented as active devices, passive devices, conductive layers, and dielectric layers formed on or within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of aluminum (Al), copper (Cu), tin (Sn), nickel (Ni), gold (Au), silver (Ag), or other suitable electrically conductive material. Conductive layer 132 operates as contact pads electrically connected to the circuits on active surface 130.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

Figure 2C:
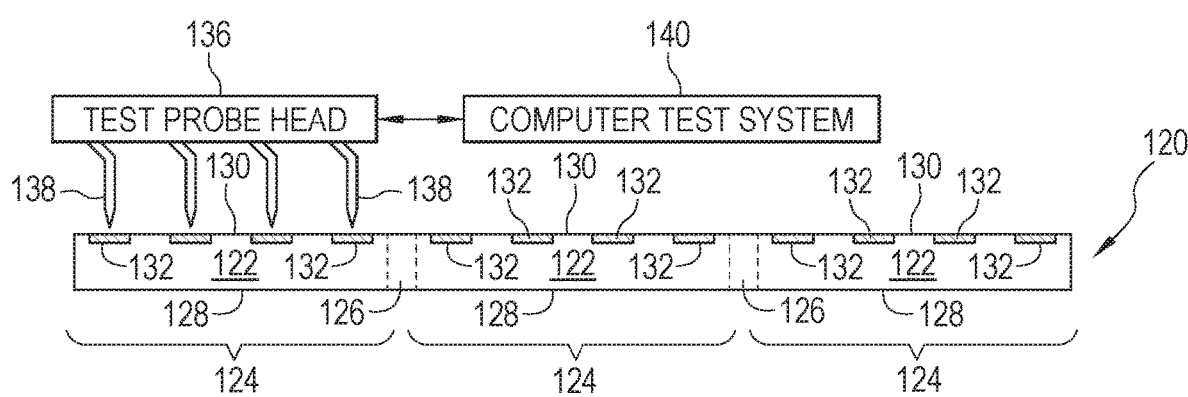

The active and passive components within semiconductor die 124 undergo testing at the wafer level for electrical performance and circuit function. Each semiconductor die 124 is tested for functionality and electrical parameters, as shown in FIG. 2c, using a test probe head 136 including a plurality of probes or test leads 138, or other testing device. Probes 138 are used to make electrical contact with circuit nodes or conductive layer 132 on each semiconductor die 124 and provide electrical stimuli to components on active surface 130. Semiconductor die 124 responds to the electrical stimuli, which is measured by computer test system 140 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

Figure 2D:
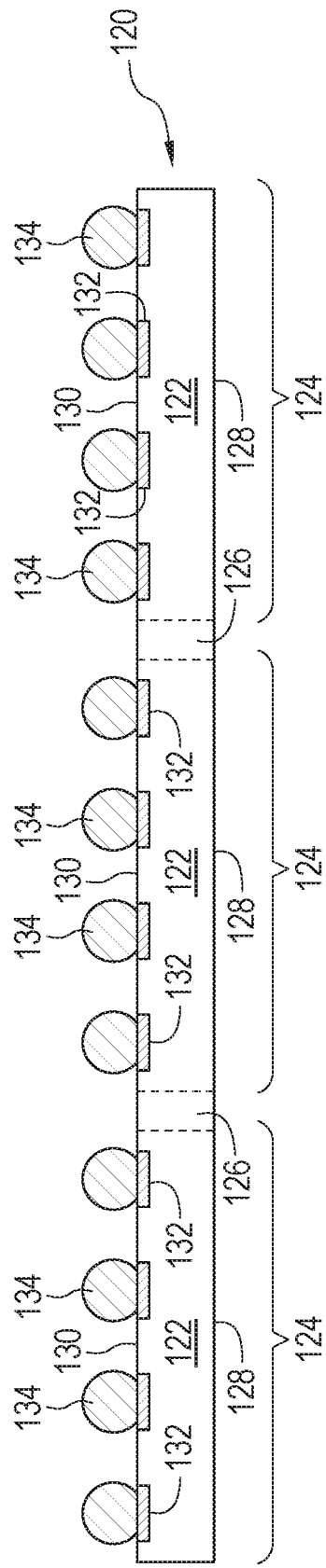

In FIG. 2d, an electrically conductive bump material is deposited over contact pads 132 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to contact pads 132 using a suitable attachment or bonding process. In one embodiment, the bump material is reflowed by heating the material above its melting point to form conductive balls or bumps 134. In some applications, conductive bumps 134 are reflowed a second time to improve electrical coupling to contact pads 132. Conductive bumps 134 can also be compression bonded or thermocompression bonded to contact pads 132. Conductive bumps 134 represent one type of interconnect structure that can be formed over contact pads 132. The interconnect structure can also use stud bump, micro bump, or other electrical interconnect.

Figure 2E:
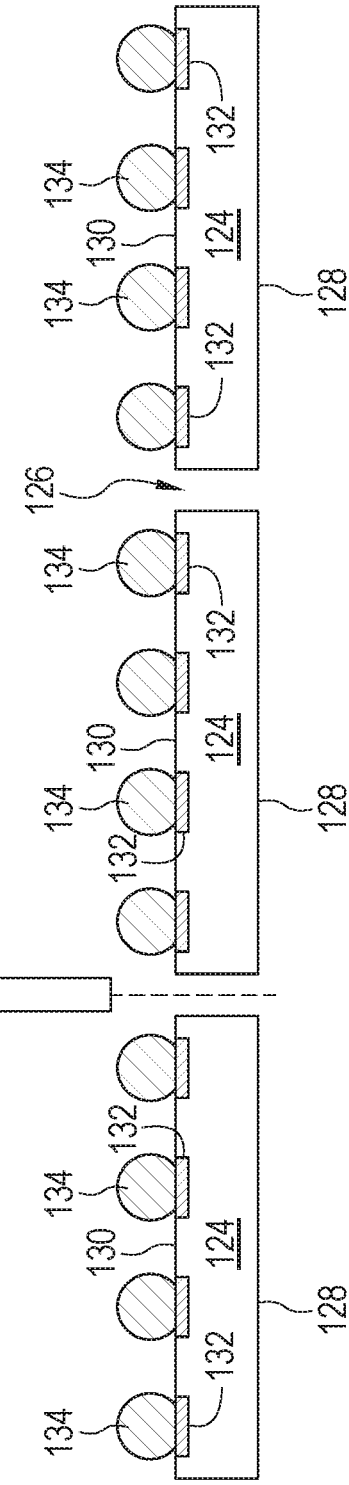

In FIG. 2e, semiconductor wafer 120 is singulated through saw street 126 using a saw blade or laser cutting tool 142 into individual semiconductor die 124. The individual semiconductor die 124 can be inspected and electrically tested for identification of KGD post singulation.

Figure 3C:
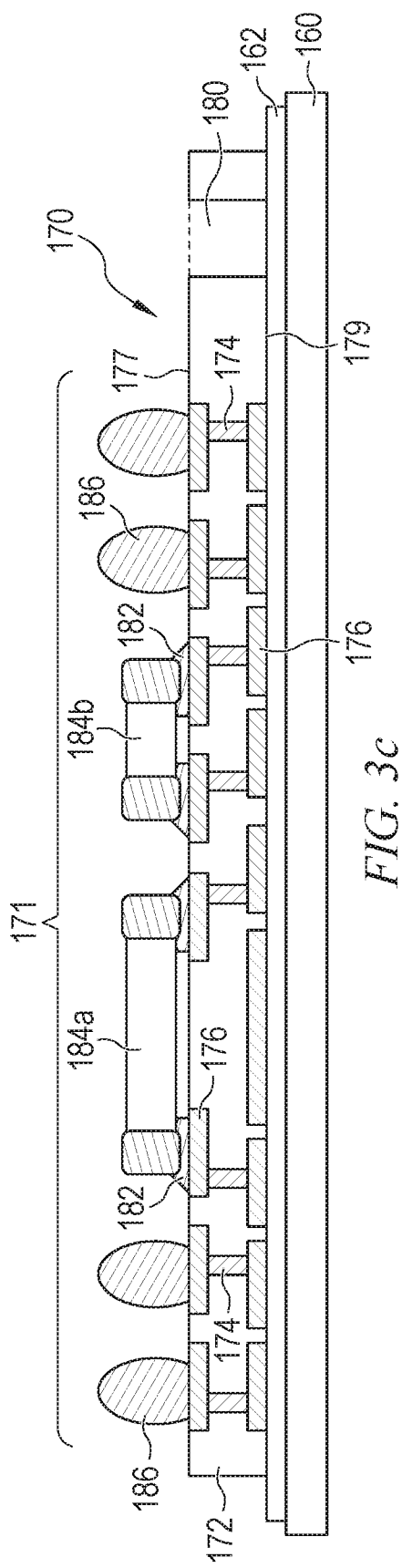

FIGS. 3a-3h illustrate, in relation to FIG. 1, a process of forming a system-in-package (SIP) device using a double-sided molding process. FIG. 3a shows a cross-sectional view of a portion of a carrier or temporary substrate 160 containing sacrificial base material such as silicon, polymer, beryllium oxide, glass, or other suitable low-cost, rigid material for structural support. An interface layer or double-sided tape 162 is formed or disposed over carrier 160 as a temporary adhesive bonding film, etch-stop layer, or thermal release layer. Carrier 160 may be a jig that holds a workpiece in place, e.g., using a clamp or chuck, during subsequent processing steps.

In FIG. 3a, package substrate 170, illustrated with only a single device region 171 where a SIP device will be formed, is disposed on carrier 160. In other embodiments, substrate 170 is much larger, with hundreds of device regions 171, or more, for making many devices in parallel. As an example, FIGS. 8a-8d illustrate embodiments of substrate 170 with twelve device regions 171. Substrate 170 can be a laminate interposer, PCB, wafer-form, strip interposer, leadframe, or another suitable substrate. Substrate 170 includes one or more insulating or passivation layers 172, one or more conductive vias 174 formed through the insulating layers, and one or more conductive layers 176 formed over or between the insulating layers. Substrate 170 may include one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Insulating layers 172 may contain one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. Substrate 170 can also be a multi-layer flexible laminate, ceramic, copper clad laminate, glass, or semiconductor wafer including an active surface containing one or more transistors, diodes, and other circuit elements to implement analog circuits or digital circuits.

Substrate 170 includes one or more electrically conductive layers or redistribution layers (RDL) 176 formed using sputtering, electrolytic plating, electroless plating, or other suitable deposition process. Conductive layers 176 can be one or more layers of Al, Cu, Sn, Ni, Au, Ag, titanium (Ti), tungsten (W), or other suitable electrically conductive material. Conductive layers 176 include lateral RDL layers to provide horizontal conduction paths across substrate 170. Conductive layers 176 are formed on or between insulating layers 172.

In FIG. 3a, only one insulating layer 172 is illustrated as a core substrate, and a conductive layer 176 is formed on each side of the insulating layer. In other embodiments, additional insulating layers 172 and conductive layers 176 are formed over the structure shown in FIG. 3a to implement more advanced signal routing. Portions of conductive layers 176 are electrically common or electrically isolated according to the design and function of the SIP package being formed. Conductive vias 174 are formed through insulating layers 172 to electrically couple adjacent levels of conductive layers 176. In one embodiment, conductive vias 174 are formed by forming an opening through insulating layer 172 by etching, drilling, or another suitable process, and then depositing conductive material into the opening. In some embodiments, conductive material for one or more conductive layers 176 is deposited in a common deposition step with one or more conductive vias 174.

One or more openings 180 are formed completely through substrate 170. Openings 180 can be formed by a punch, a mechanical drill, a laser drill, a water drill, a saw blade, by patterning insulating layers 172 and conductive layers 176 as substrate 170 is built-up, or by another suitable process. Opening 180 is formed outside of device region 171, so device layout options are not significantly reduced by the opening. Opening 180 allows a molding compound or encapsulant to flow between the top and bottom sides of substrate 170 during a subsequent molding step.

In FIG. 3b, solder paste 182 is deposited or printed onto conductive layer 176 at locations where devices are to be surface mounted onto bottom surface 177 of substrate 170. Solder paste 182 can be dispensed by jet printing, laser printing, pneumatically, by pin transfer, using a photoresist mask, by stencil-printing, or by another suitable process. In FIG. 3c, discrete devices 184 are disposed over bottom surface 177 with terminals of the discrete devices over solder paste 182. Discrete devices 184 can be passive or active devices as desired to implement any given electrical functionality within the semiconductor package being formed. Discrete devices 184 can be active devices such as semiconductor die, semiconductor packages, discrete transistors, discrete diodes, etc. Discrete devices 184 can also be passive devices such as capacitors, inductors, or resistors.

Bump material is also deposited over other portions of bottom surface 177 to form conductive bumps 186. Conductive bumps 186 are formed similarly to conductive bumps 134 above. The material for conductive bumps 186 may be deposited as a paste along with solder paste 182, or using a different material in a separate ball drop step. The bump material and solder paste 182 are reflowed to form conductive bumps 186 and to mechanically and electrically couple discrete devices 184 to conductive layer 176. Solder paste 182 may be reflowed prior to depositing conductive bumps 186 to hold discrete devices 184 in place during the ball drop process.

Figure 3D:
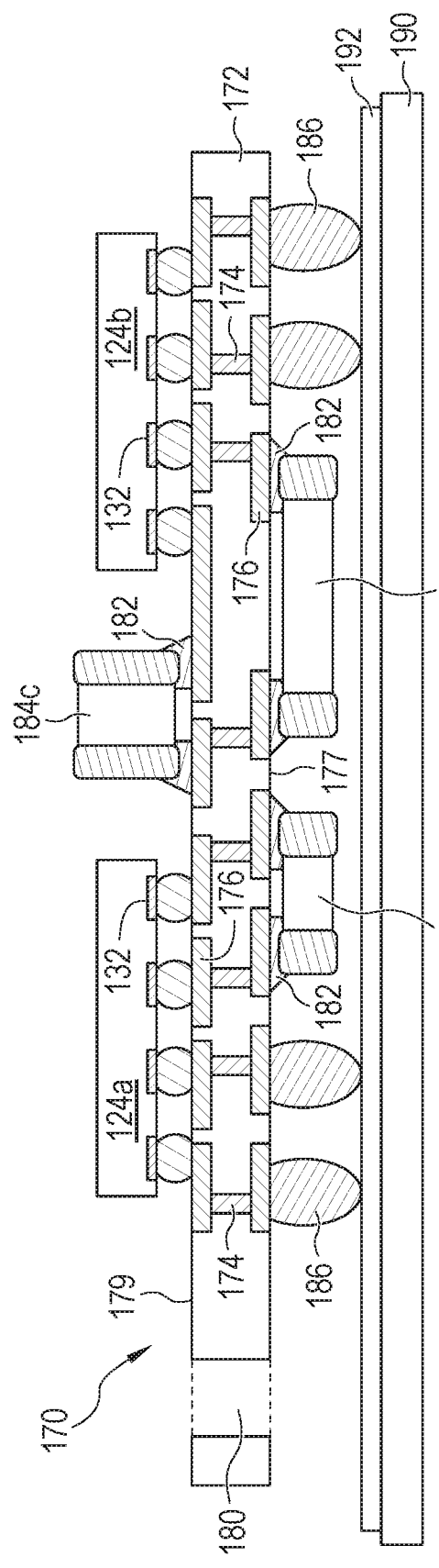

In FIG. 3d, carrier 160 is removed by chemical etching, mechanical peeling, chemical mechanical planarization (CMP), mechanical grinding, thermal bake, UV light, laser scanning, wet stripping, or another suitable process to expose top surface 179 of substrate 170. Substrate 170 is flipped and disposed over carrier 190 with bottom surface 177 oriented toward the carrier. Carrier 190 includes an optional double-sided tape, thermal release layer, or other interface layer 192. In other embodiments, carrier 190 is a jig. In one embodiment, carrier 160 is reused as carrier 190.

Solder paste 182 is patterned onto top surface 179 of substrate 170, and any desired discrete devices 184 are surface mounted as described above. Semiconductor die 124a and 124b are flip-chip mounted onto top surface 179. Semiconductor die 124a and 124b can implement different functionality desired for the package being created, e.g., semiconductor die 124a might be an application processor, and semiconductor die 124b might be a memory chip that the application processor uses. Conductive bumps 134 are reflowed to mechanically and electrically connect semiconductor die 124 to conductive layer 176. Semiconductor die 124 and discrete devices 184 on top surface 179 are electrically connected to discrete devices 184 and conductive bumps 186 on bottom surface 177 through conductive layers 176 and conductive vias 174.

Figure 3E:
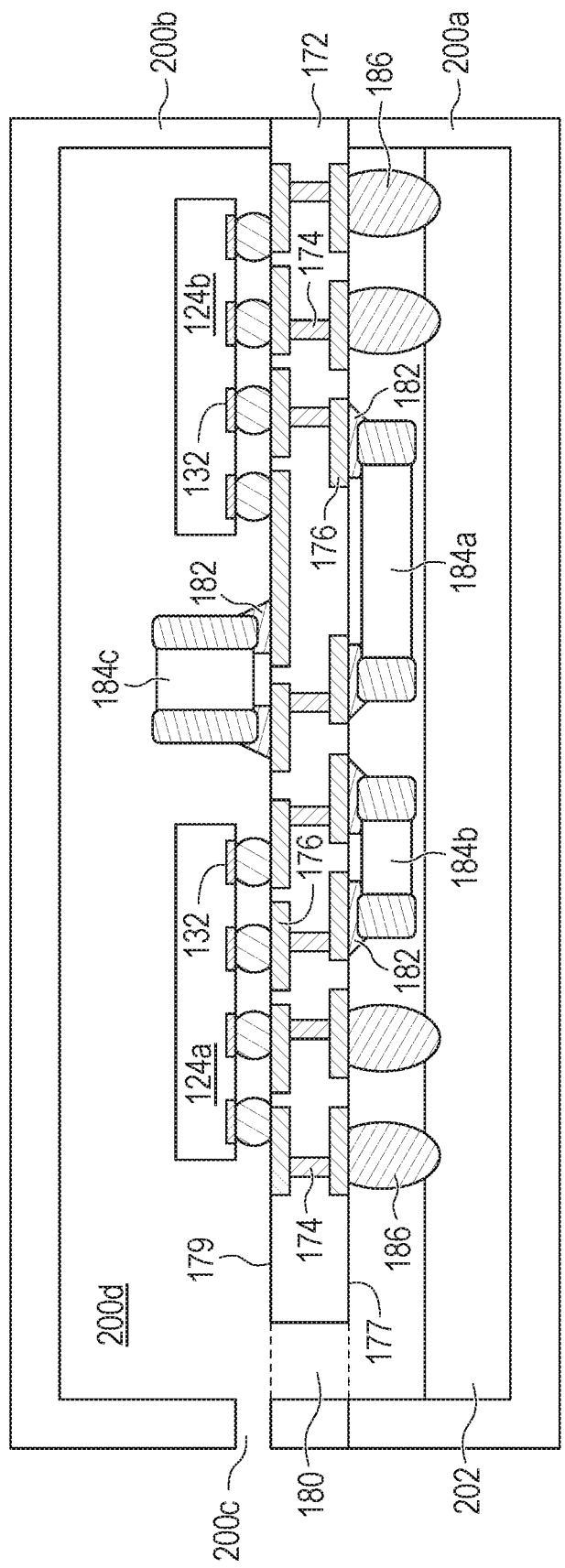

In FIG. 3e, substrate 170 with discrete devices 184, conductive bumps 186, and semiconductor die 124 is disposed within a mold 200. Mold 200 includes a bottom plate 200a and a top plate 200b. One or more inlet ports 200c are formed in a sidewall of top plate 200b for injection of encapsulant into the mold. Alternatively, opening 200c may be formed in bottom plate 200a. In some embodiments, mold 200 includes openings opposite opening 200c to allow displaced air to escape the mold during injection of encapsulant. While opening 200c is illustrated as being directly adjacent to substrate 170, a portion of top plate 200b extends between opening 200c and substrate 170 in some embodiments. Bottom plate 200a and top plate 200b define a mold cavity 200d. Mold cavity 200d is of sufficient depth, as defined by the height of sidewalls of top plate 200b and bottom plate 200a, to accommodate any electrical components disposed on substrate 170.

Bottom plate 200a includes a mold film 202 within cavity 200d. Mold film 202 is formed from any suitable material. In some embodiments, an insulating polymer material is used. In one embodiment, mold film 202 extends outside of mold 200 between plates 200a and 200b, and is pulled down to contact bottom plate 200a by using a vacuum connected to bottom plate 200a to remove air between the mold film and bottom plate.

Figure 3F:
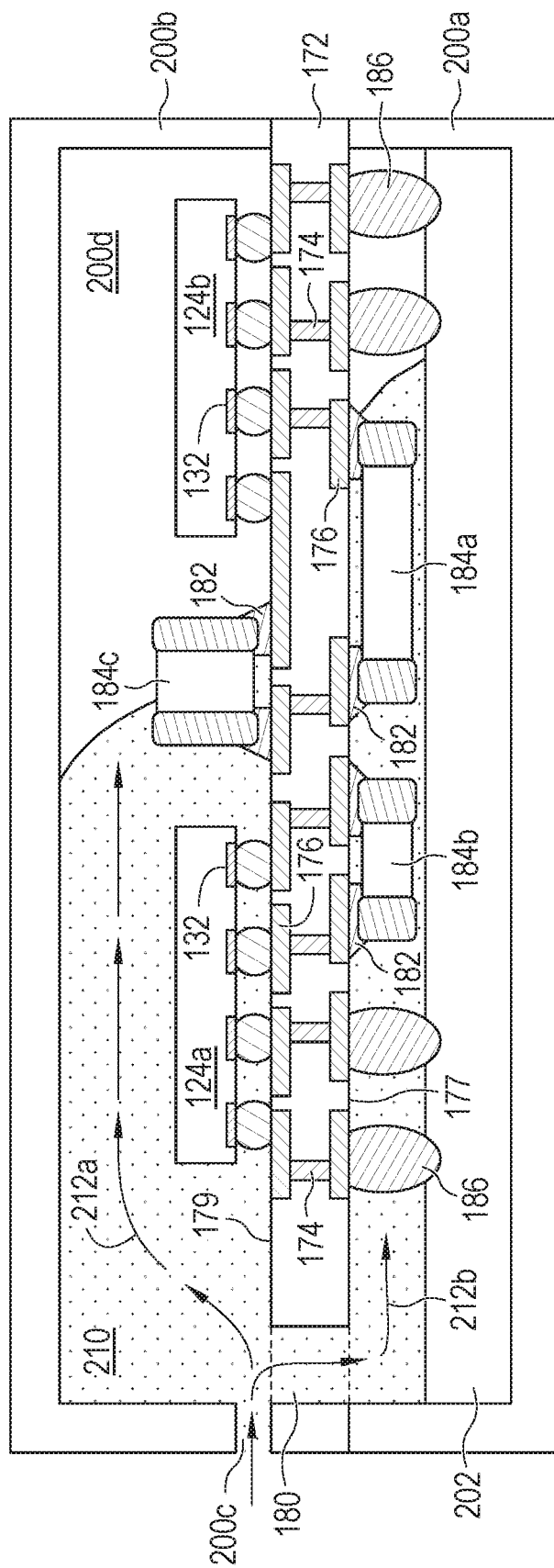

Substrate 160 is disposed within mold 200 over mold film 202. Conductive bumps 186 are pressed into mold film 202, and the conductive bumps displace a portion of the mold film material. In one embodiment, mold film 202 has a low elastic modulus to help conductive bumps 186 be inserted into the film. In FIG. 3f, an encapsulant or molding compound 210 is injected into cavity 200d through opening 200c. Encapsulant 210 fully covers each side of semiconductor die 124, discrete devices 184, and conductive bumps 186 other than where those elements contact substrate 170, solder paste 182, conductive bumps 134, mold 200, or mold film 202. In particular, contact between conductive bumps 186 and mold film 202 leaves tips of the conductive bumps devoid of encapsulant 210. Encapsulant 210 can be polymer composite material, such as epoxy resin with filler, epoxy acrylate with filler, or polymer with proper filler. Encapsulant 210 is non-conductive and environmentally protects the semiconductor device from external elements and contaminants. Encapsulant 210 also protects semiconductor die 124 from degradation due to exposure to light.

Encapsulant 210 is injected into opening 200c and takes two different paths to cover substrate 170. A first portion of encapsulant 210 follows path 212a to cover top surface 179 including semiconductor die 124 and discrete device 184c. A second portion of encapsulant 210 follows path 212b through opening 180 to cover bottom surface 177 of substrate 170, including covering exposed portions of conductive bumps 186 and discrete devices 184a-184b.

In FIG. 3g, substrate 170 covered in encapsulant 210 is removed from mold 200. Encapsulant 210 over substrate 170, including elements mounted on substrate 170, forms a sheet or mat of encapsulated devices. While only one device is shown in FIG. 3g, many devices would normally be formed together on a common substrate 170 and encapsulated in a single molding step. Encapsulant 210 completely covers semiconductor die 124 and discrete devices 184. Portions of substrate 170 outside of device regions 171 are exposed from the encapsulant because of mold 200 pressing against the substrate to hold the substrate in place during molding.

Conductive bumps 186 are exposed from and extend over a bottom surface of encapsulant 210 because of the conductive bumps being partially embedded within mold film 202 while encapsulant 210 is deposited. Discrete devices 184a-184b include a shorter height over bottom surface 177 than conductive bumps 186, and are not embedded in mold film 202 during molding. Therefore, encapsulant 210 fully covers discrete devices 184 but not conductive bumps 186. In other embodiments, a device mounted on surface 177, whether a semiconductor die 124, discrete device 184, or other component, may be embedded in mold film 202 in addition to conductive bumps 186 and will be exposed from encapsulant 210 when the molded panel is removed from mold 200. In one embodiment, mold film 202 is a thermal or UV release film for easier removal from encapsulant 210 and conductive bumps 186 in case the mold film sticks to the device.

In FIG. 3h, the panel as removed from mold 200 is singulated through substrate 170 and encapsulant 210 to separate the individual device regions 171 into double-sided molding SIP packages 220 using saw blade or laser cutting tool 216. Singulation results in side surfaces of encapsulant 210 being coplanar with side surfaces of substrate 170.

FIG. 4 illustrates a singulated double-sided molding SIP package 220 mounted onto PCB 52. Conductive bumps 186 are reflowed onto contact pads of conductive traces 54 to mechanically and electrically connect package 220 to PCB 52. Conductive traces 54 electrically connect the electrical components in package 220 to other components of electronic device 50 per any desired electrical functionality. Semiconductor die 124 and discrete devices 184 are electrically connected to PCB 52 and each other through conductive layer 176, conductive vias 174, and conductive bumps 186.

The double-sided molding method employed in forming SIP package 220 requires only a single molding step, saving time and capital expenditure required to set up a manufacturing line with two separate molding steps. A single molding step is also more straightforward from a technical standpoint due to reduced substrate strip warpage and cycle time. Opening 180 at the edge of substrate 170, near sidewalls of mold 200, or in saw streets of the substrate, maintains design flexibility within device region 171.

FIG. 5 illustrates SIP package 230. SIP package 230 is similar to SIP package 220 in FIG. 4, but with conductive bumps 186 replaced by conductive pillars 232. In one embodiment, conductive pillars 232 are formed by depositing a mask over bottom surface 177, forming openings through the mask to expose conductive layer 176 in locations where the conductive pillars are desired, and depositing a conductive material into the mask openings. In other embodiments, conductive pillars 232 are formed using other additive, semi-additive, or subtractive metal deposition techniques. Conductive pillars 232 are formed from Al, Cu, Sn, Ni, Au, Ag, combinations thereof, or other suitable electrically conductive material.

Substrate 170 with conductive pillars 232 formed, and with semiconductor die 124 and discrete devices 184 disposed on the substrate, is placed into mold 200 with ends of the conductive pillars embedded into mold film 202. Mold film 202 blocks encapsulant 210 from completely covering conductive pillars 232, so the conductive pillars extend from the encapsulant after removal from mold 200. SIP package 230 can be mounted to PCB 52 and electrically connected to traces 54 using solder paste or another suitable mechanism. Conductive pillars 232 increase the potential pitch of interconnect between substrate 170 and PCB 52 relative to conductive bumps 186. Conductive bumps 168 are reflowed, and must be kept a minimum distance apart to reduce the likelihood that two conductive bumps reflow together and short circuit. Conductive pillars 232 are formed in a manner that can be at a tighter pitch without significantly increasing risk of a short circuit.

Figure 6A:
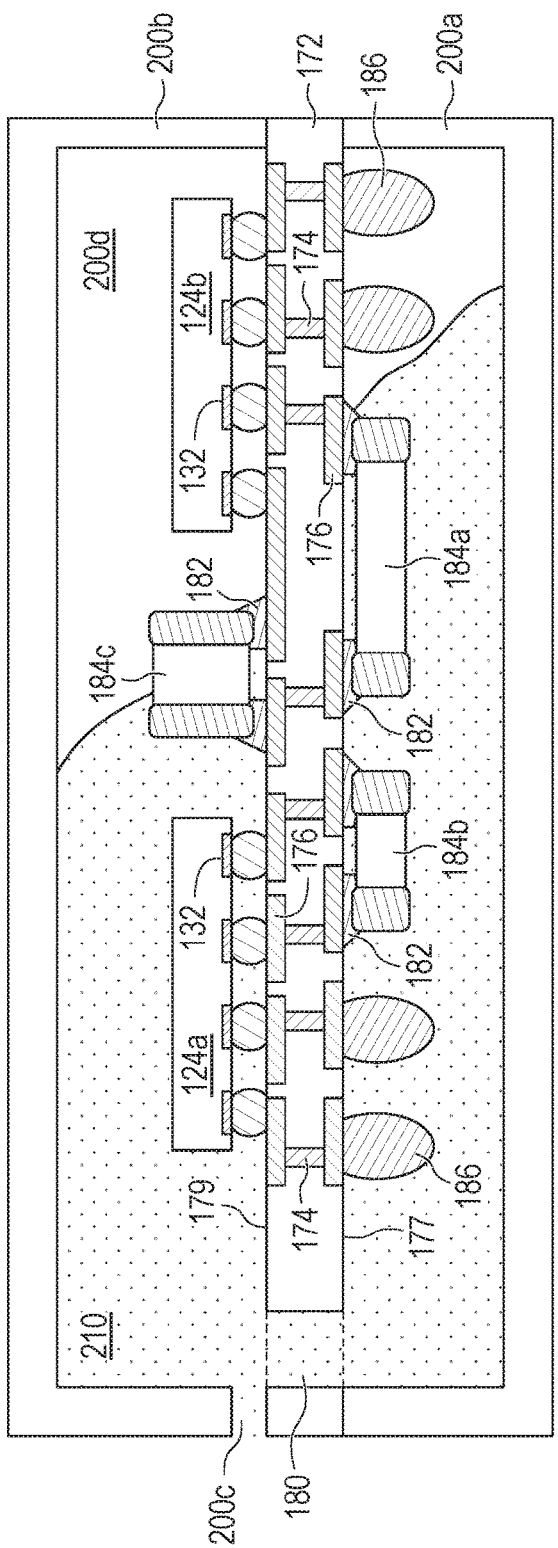
FIGS. 6a-6b illustrate double-sided molding and then backgrinding to expose interconnect structures.
Figure 6B:
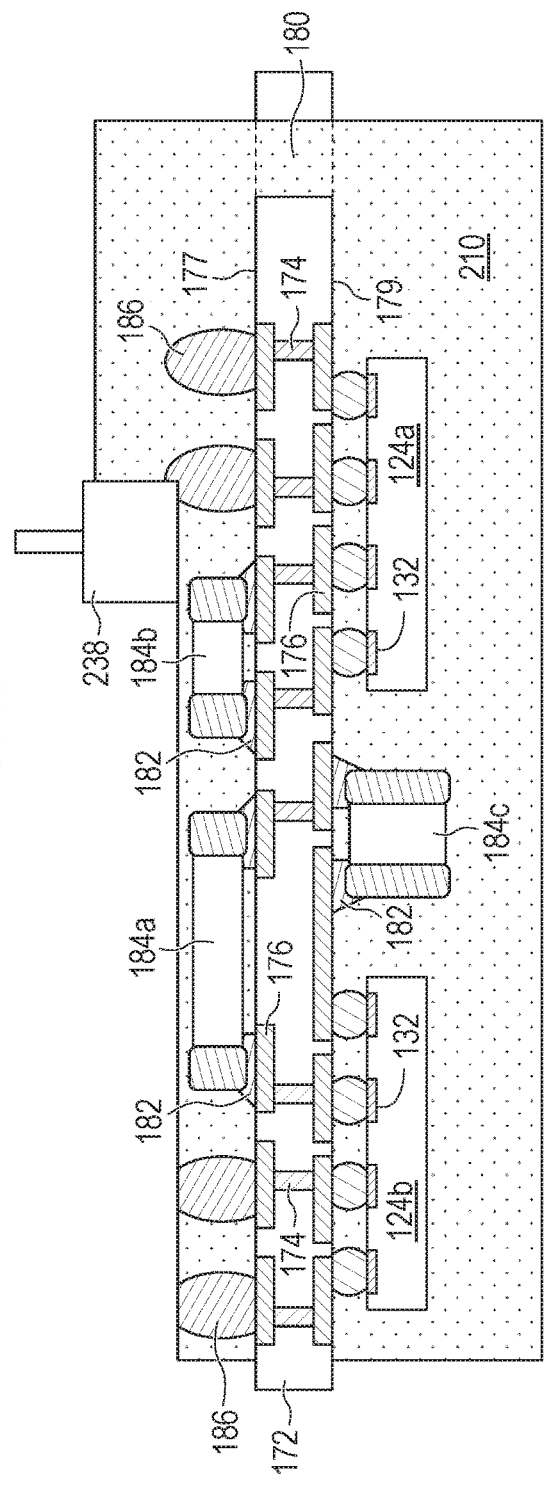

FIGS. 6a-6b illustrate forming a double-sided molding SIP package without film assistance. In FIG. 6a, substrate 170 with conductive bumps 186, semiconductor die 124, and discrete devices 184 is disposed in mold 200 without mold film 202. Encapsulant 210 is injected into mold 200 as in FIG. 3f, but fully covers conductive bumps 186 without mold film 202 partially protecting the conductive bumps from the encapsulant.

In FIG. 6b, substrate 170 with encapsulant 210 is removed from mold 200. A backgrinding operation with grinder 240, or another suitable chemical or mechanical grinding or etching process, is used to reduce a thickness of encapsulant 210 and expose conductive bumps 186. Conductive pillars 232 or other types of interconnect structures are used in other embodiments, and exposed by planarization. Planarization in FIG. 6b results in a bottom surface of encapsulant 210 that is coplanar with a surface of conductive bumps 186 by removing portions of the conductive bumps and encapsulant to approximately the same level over substrate 170. A planarized package with conductive bumps 186 exposed can be disposed over PCB 52 and the conductive bumps reflowed onto traces 54. In some embodiments, an additional amount of solder paste is printed onto traces 54 and reflowed together with conductive bumps 186.

Figure 7C:
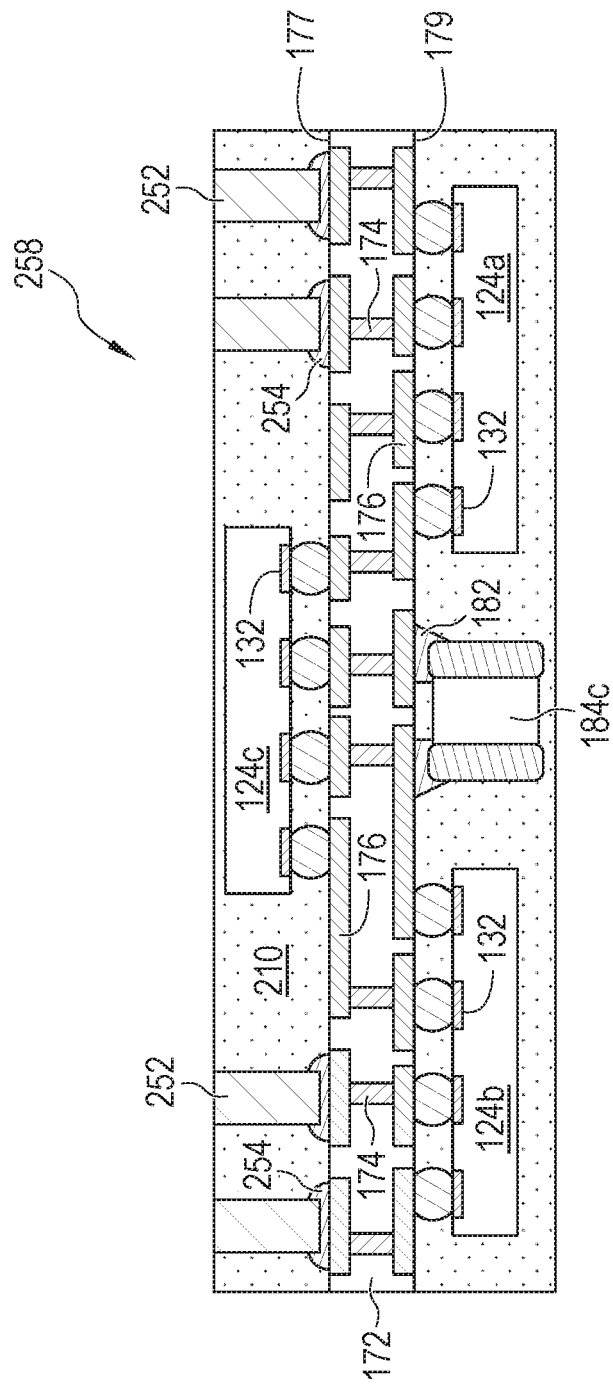

FIGS. 7a-7c illustrate an embodiment utilizing a leadframe 250. Leadframe 250 is a solid conductive material, e.g., Au, Cu, Ag, Al, alloys thereof, or other appropriate conductive materials, and includes a base and a plurality of conductive pillars 252 extending from the base. Conductive pillars 252 are formed on leadframe 250 at locations where external interconnection to substrate 170 is desired. The base of leadframe 250 can be a flat plate extending continuously across the entirety of each device region 171, or can include openings with just enough material in the base to physically connect each pillar 252 to each other. A semiconductor die 124c is disposed on bottom surface 177 rather than discrete devices 184a-184b in previous embodiments. However, any combination of semiconductor die 124, discrete devices 184, or other desired components can be used on bottom surface 177 and top surface 179 in any of the disclosed embodiments.

Leadframe 250 is disposed over substrate 170 with conductive pillars 252 oriented toward the substrate and aligned with contact pads of conductive layer 176. Solder paste 254 is printed or otherwise disposed on pillars 252 or conductive layer 176 and reflowed to electrically and mechanically couple leadframe 250 to substrate 170. Substrate 170 is flipped to mount any desired components to top surface 179.

In FIG. 7b, substrate 170 with leadframe 250 is disposed in mold 200. Encapsulant 210 is injected over both bottom surface 177 and top surface 179 through opening 200c of mold 200 and opening 180 of substrate 170. Encapsulant 210 surrounds conductive pillars 252 of leadframe 250. The base of leadframe 250 remains exposed from encapsulant 210 due to contact with optional mold film 256. In other embodiments, leadframe 250 directly contacts bottom plate 200a to remain exposed from the encapsulant, or encapsulant may be allowed to fully surround the leadframe base.

In FIG. 7c, SIP package 258 is completed by removing the panel from mold 200. A backgrinding operation similar to that shown in FIG. 6b is used to remove the base of leadframe 250 and a portion of encapsulant 210. Removal of the base of leadframe 250 electrically isolates conductive pillars 252, and exposes the conductive pillars from encapsulant 210 for subsequent connection to PCB 52. In some embodiments, a solder paste or other conductive material is printed on conductive pillars 252 after planarization to aid in making the connection to PCB 52. The panel removed from mold 200 is singulated using a laser cutting tool, saw blade, or other appropriate equipment to separate devices formed together from each other.

FIGS. 8a-8d illustrate different configurations for openings 180 in substrate 170. Substrate 170 in FIGS. 8a-8d includes twelve total device regions 171 to form twelve SIP devices at a time. Device regions 171 are split into three columns 259a-259c with four devices per column. In FIG. 8a, a single opening 180 through substrate 170 allows encapsulant 210 to flow from top-to-bottom of mold 200, or vice versa, as the encapsulant is injected during the molding step. Opening 180 is located near the injection point of mold 200 to promote easier flow of encapsulant through the opening. A single opening 180 extends across each column 259 of device regions 171 to allow encapsulant to flow through substrate 170 across an entire width of the substrate.

FIG. 8b illustrates substrate 170 with three separate openings 180b formed through the substrate at an edge of the substrate adjacent to where encapsulant will be injected into mold 200. A separate opening 180b is formed for each column 259. FIG. 8c illustrates substrate 170 with openings 180b, and additional openings 180c formed in saw streets between adjacent device regions 171. Openings 180c allow encapsulant 210 to flow from the top side of substrate 170 to the bottom side, or vice versa, at various points throughout the length and width of the substrate. Openings 180c are particularly helpful when the flow rate of encapsulant 210 through openings 180b is insufficient to totally fill bottom plate 200a and top plate 200b at approximately the same rate. Openings 180c in FIG. 8c are formed between each adjacent pair of device regions 171 in a common column 259. In other embodiments, some adjacent pairs of device regions 171 have openings 180c and some do not.

FIG. 8d illustrates an embodiment with openings 180c alternating only every other device region 171. In addition, adjacent columns 259 have offset patterns of openings 180c to form a checkerboard pattern. In other embodiments, any desired pattern of openings 180c is used. FIG. 8d also adds openings 180d formed in saw streets between adjacent columns 259. Again, any desired combination of openings 180a, 180b, 180c, and 180d can be used. Openings 180 are generally formed within saw streets or at the edges of substrate 170. Openings 180 in device regions 171 may cause design limitations for the devices formed on substrate 170, although one having ordinary skill in the art could form openings 180 within device regions 171 if so desired.

Figure 9:
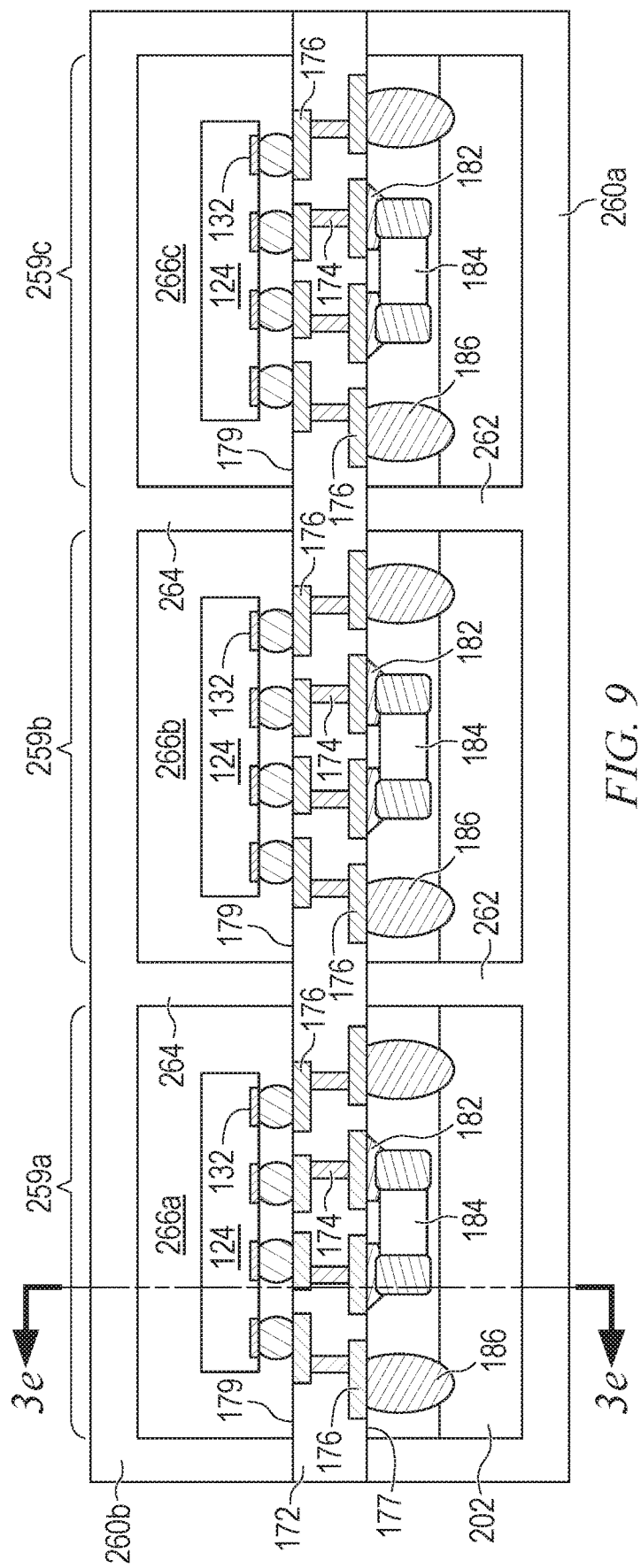
FIG. 9 illustrates a mold with internal walls or pillars to support a SIP substrate.

FIG. 9 illustrates leadframe 170 in mold 260 as an alternative mold design to mold 200. Mold 260 includes a bottom plate 260a and top plate 260b. Bottom plate 260a includes extensions 262, and top plate 260b includes extensions 264, between columns 259 of leadframe 170. Extensions 262 and 264 contact substrate 170 between device regions 171 to provide mechanical support to the substrate. Extensions 262 and 264 provide extra support to substrate 170, reducing warpage of the substrate. A flatter substrate 170 during molding promotes a uniform thickness of encapsulant 210 over both sides of substrate 170 across each device region 171.

In one embodiment, extensions 262 and 264 run continuously for the length of each column 259. Extensions 262 and 264 separate each column 259 of device regions 171 into an isolated chamber 266a-266c. Mold 260 includes an opening for each column 259 to inject encapsulant 210 into each column at once. Encapsulant 210 does not flow across the boundary between columns 259 established by extensions 262 and 264, even though the encapsulant freely flows between bottom plate 260a and top plate 260b through openings 180. In other embodiments, extensions 262 and 264 are provided as pillars or other structures that do not fully separate adjacent columns 259. Encapsulant 210 would then flow between adjacent columns 259.

Formation of devices proceeds similarly to FIGS. 3a-3h, but with the addition of extensions 262 and 264 to support substrate 170. In some embodiments, top plate 200b is used with bottom plate 260a. Extensions 262 of bottom plate 200b support substrate 170 from sagging without need for extensions 264.

Figure 10A:
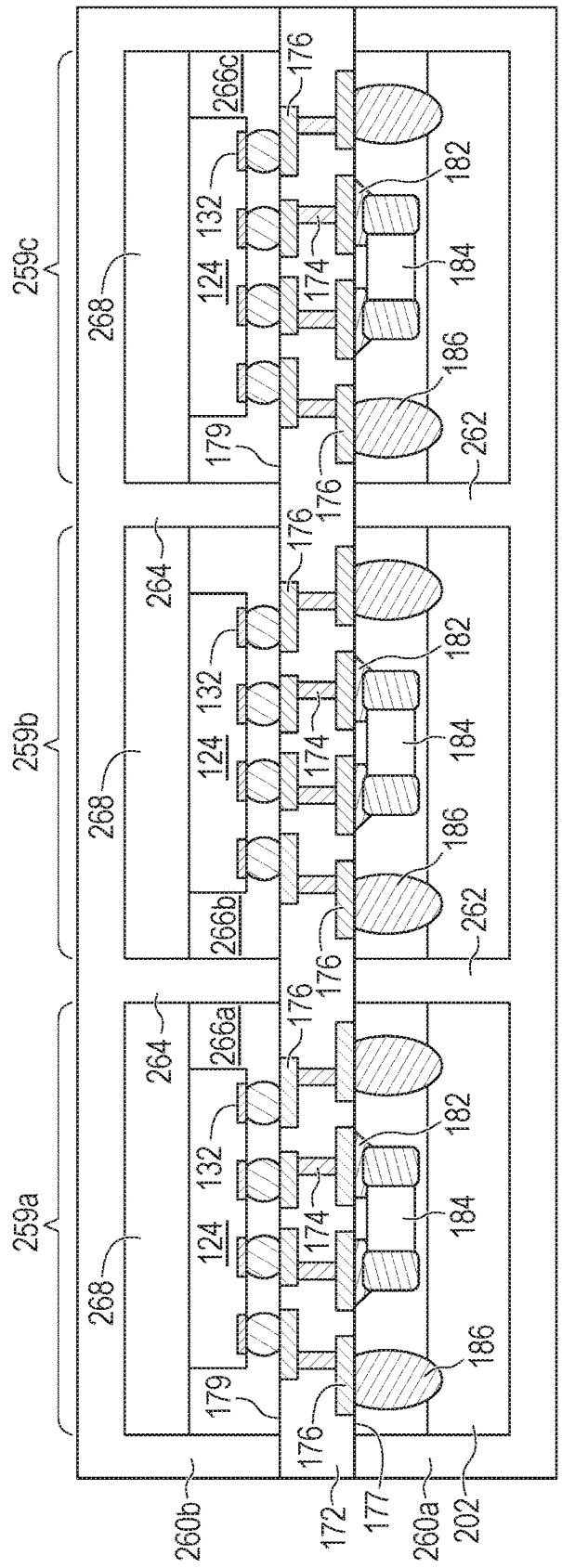
FIGS. 10a-10b illustrate dual-side film-assisted molding.
Figure 10B:
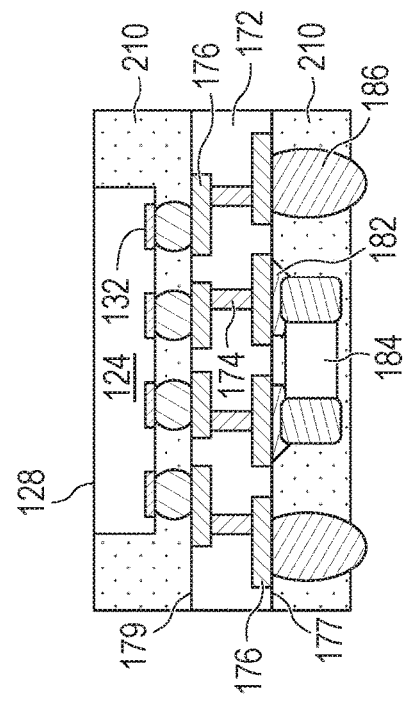

FIG. 10a-10b illustrates a dual-side film-assisted molding embodiment that can apply to any of the above or below SIP packages. In addition to partially embedding conductive bumps 186 in mold film 202, mold film 268 is provided in upper plate 200b or 260b. When substrate 170 is placed in mold 260, semiconductor die 124 contacts mold film 268. Therefore, encapsulant 210 flows into mold 260 but does not cover back surface 128 of semiconductor die 124.

FIG. 10b illustrates a SIP package after double-sided film-assisted molding. Conductive bumps 186 are exposed on the bottom of the package. Semiconductor die 124 is exposed at the top of the package. Exposing semiconductor die 124 allows a heat spreader to be applied to the package after encapsulation that directly contacts the semiconductor die. In other embodiments, any feature on any surface of substrate 170 that one desires to leave exposed from encapsulant 210 can be positioned to contact either mold film 202 or mold film 268 during the molding process.

Figure 11A:
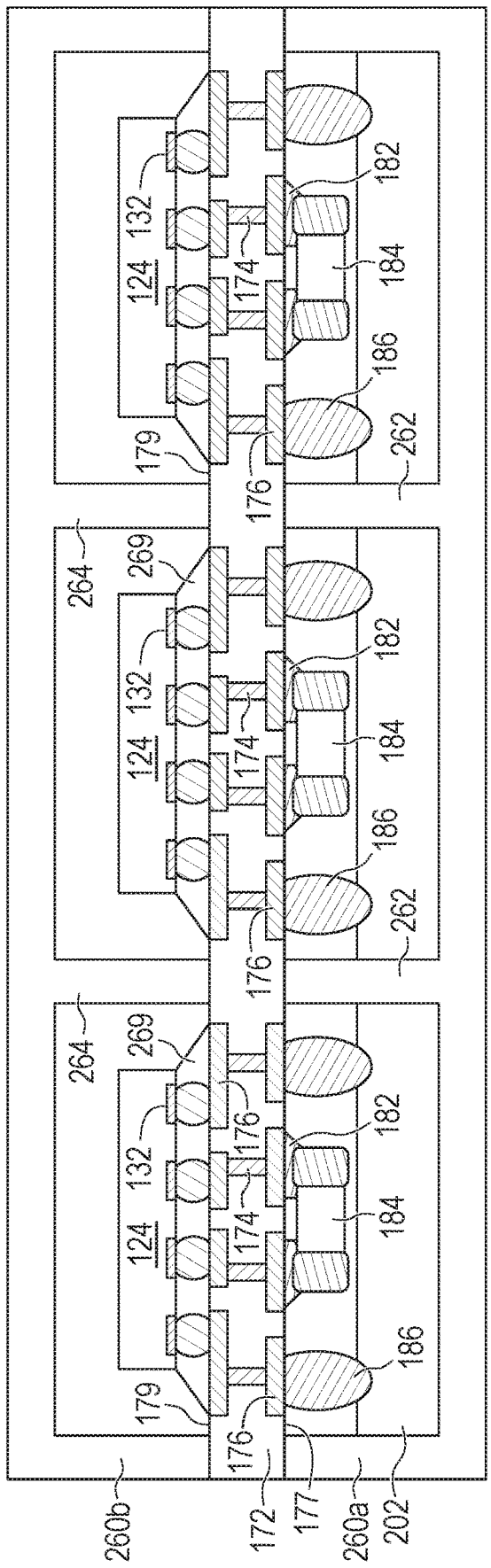
FIGS. 11a-11b illustrate using a mold underfill with the double-sided molding process.
Figure 11B:
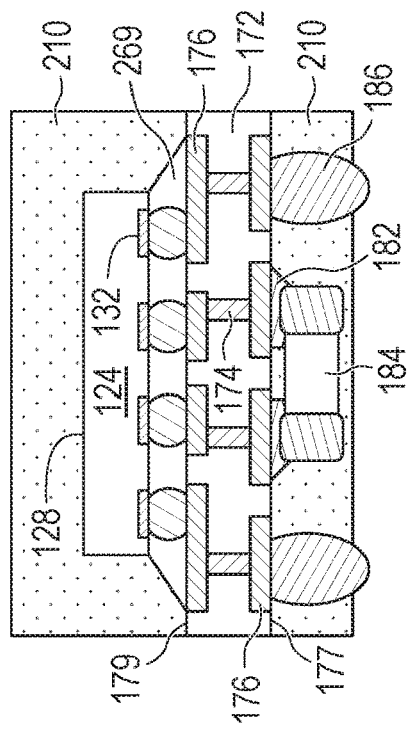

FIGS. 11a-b illustrate an embodiment with mold-underfill (MUF) 269 between semiconductor die 124 and substrate 170. MUF 269 can be applied to semiconductor die 124 after conductive bumps 134, or can be applied to substrate 170. Having MUF 269 around conductive bumps 134 separate from encapsulant 210 helps to reduce voids in insulating material between the conductive bumps. Especially with finer pitched conductive bumps 134, getting encapsulant 210 to fully fill in under semiconductor die 124 between the conductive bumps can present a challenge. MUF 269 is more likely to completely fill the space between semiconductor die 124 and substrate 170 without leaving voids.

FIG. 11b illustrates a SIP package with MUF 269 used in addition to encapsulant 210. Encapsulant 210 covers the side and back surfaces of semiconductor die 124, while MUF 269 covers active surface 130 and extends to substrate 170. Any of the above or below embodiments can be formed with the addition of MUF 269 between semiconductor die 124 and substrate 170.

Figure 12A:
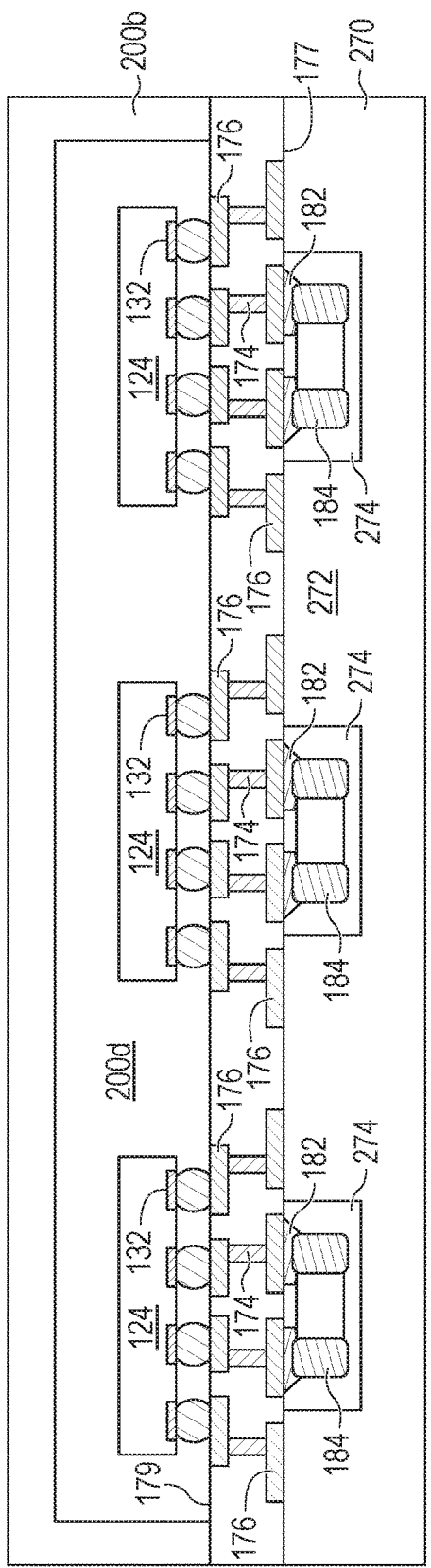
FIGS. 12a-12b illustrate forming double-sided molding with bottom-side finger molding.
Figure 12B:
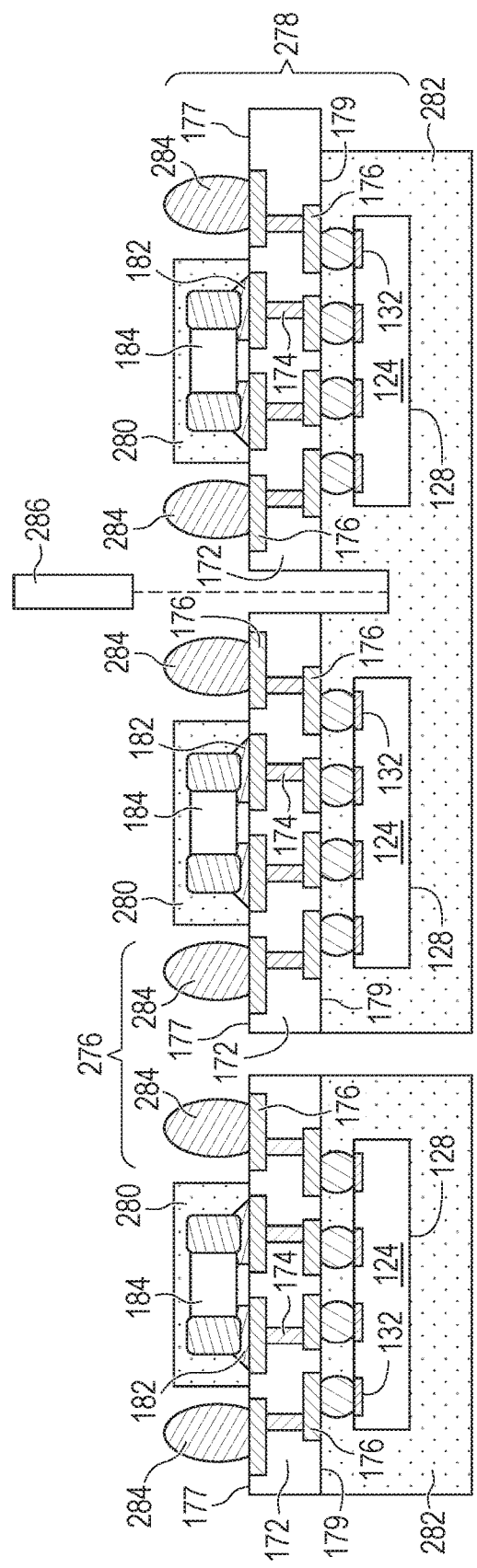

FIGS. 12a-12b illustrate forming a device with finger molding on bottom surface 177 of substrate 170. Top plate 200b or top plate 260b is used as with previous embodiments. However, a different bottom plate 270 is provided. Bottom plate 270 includes platforms 272 straddling adjacent device regions 171, and finger cavities 274 extending along each column 259. Substrate 170 has any desired discrete devices 184 and semiconductor die 124 mounted on lower surface 177 and top surface 179, but without conductive bumps 186.

When substrate 170 is placed on bottom plate 270, any discrete device 184 and semiconductor die 124 on bottom surface 177 lie within finger cavity 274 so that bottom surface 177 contacts platforms 272 of the bottom plate. When encapsulant 210 is injected into the mold, cavity 200d of top plate 200b and finger cavity 274 of bottom plate 270 are filled with encapsulant to cover discrete devices 184 and semiconductor die 124. Portions of conductive layer 176 on bottom surface 177 to be used for external interconnection to the final package are in contact with platforms 272. The portions of conductive layer 176 contacting platforms 272 remain devoid of, or exposed from, encapsulant 210 after molding. Platforms 272 in contact with substrate 170 block encapsulant from flowing over the portions of conductive layer 176 to be used for external interconnection.

In FIG. 12b, panel 278 is removed from the mold, leaving an interconnect area 276 of bottom surface 177 exposed where platforms 272 contacted substrate 170. Conductive bumps 284 are formed in the exposed interconnect area on conductive layer 176 in a similar manner to conductive bumps 186 in previous embodiments. After bumping, the panel is singulated into individual finger molded SIP packages using saw blade or laser cutting tool 286. Conductive bumps 284 can extend further over surface 177 of substrate 170 than the bottom portion 280 of encapsulant 210, or can be shorter. Other interconnect structures, such as conductive pillars, stud bumps, or wire bonds are used as appropriate for a given situation instead of conductive bumps 284.

Figure 13D:
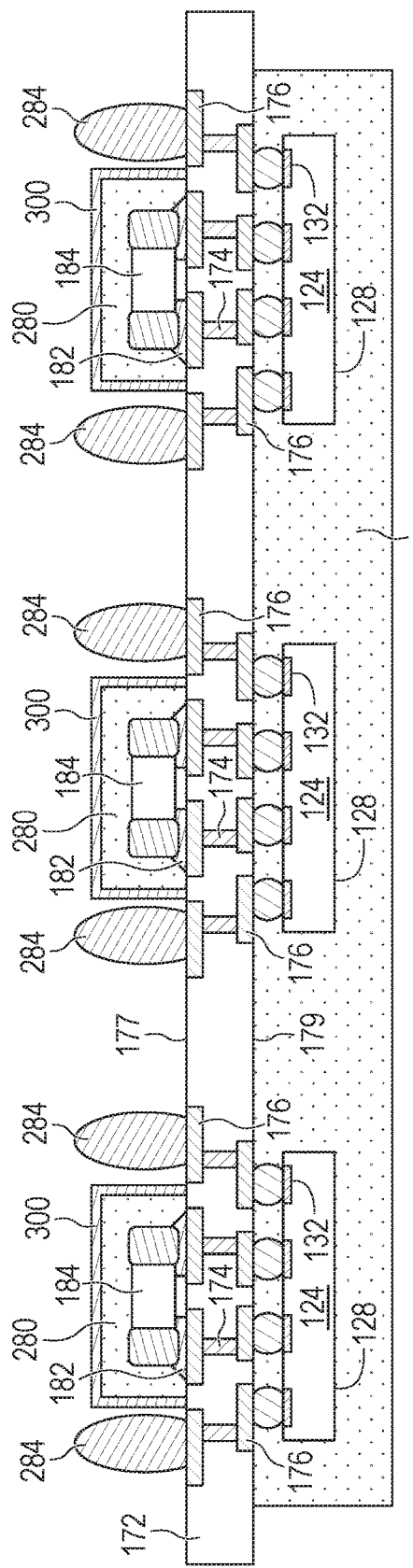

FIGS. 13a-13f illustrate finger molding bottom surface 177 of substrate 170, with the addition of shielding layers. FIG. 13a illustrates the panel 278 after being removed from top plate 200b and bottom plate 270 in FIG. 12a. Incidentally, FIG. 13a shows what panel 278 looks like in plan view before conductive bumps 284 are disposed in interconnect areas 276 and before the devices are singulated in FIG. 12b. In FIG. 13b, a saw blade or laser cutting tool 288 is used to half-cut panel 278 through finger molded encapsulant 280. The half-cut singulation in FIG. 13b extends through saw streets perpendicular to device columns 259 to separate finger molded encapsulant 280 into a separate encapsulant portion 280a for each individual device region 171. The half-cut singulation removes a portion of finger molded encapsulant 280 within saw streets 290, but does not fully singulate through panel 278. The depth of the half-cut by saw 288 can be as deep as completely through substrate 170 and partially through top portion 282 of encapsulant 210, or as shallow as only partially through finger molded encapsulant 280. Technically, the cut could be completely through panel 278, but only performing a partial cut has the benefit of encapsulant 210 partially remaining to hold each unit together.

In FIG. 13c, a tape 296 or other mask is applied between adjacent finger molded portions 280a within the interconnect areas 276. A shielding layer 300 is applied over finger molded portions 280 using appropriate metal deposition techniques, e.g., CVD, PVD, or electroless plating. Tape 296 blocks the deposited metal from sticking in interconnect area 276. Shielding layer 300 covers the top surface and each side surface of each finger molded encapsulant portion 280 over each device region 171 because the half-cut singulation in FIG. 13b exposed the final two side surfaces of each unit. Shield layer 300 forms a cap over discrete device 184 and any other components mounted on bottom surface 177. In some embodiments, a cap is preformed and placed over each finger molded encapsulant portion 280a. The preformed caps can be held on by being press fit over encapsulant portions 280a, by an adhesive, or by other appropriate means.

In FIG. 13d, tape 296 is removed by mechanical peeling, UV release, thermal release, chemically etching, or another means appropriate for the type of tape being used. Removal of tape 296 also removes the portions of shielding layer 300 in interconnect region 276 to expose portions of conductive layer 176. Conductive bumps 284 are then formed as in FIG. 12b.

Figure 13E:
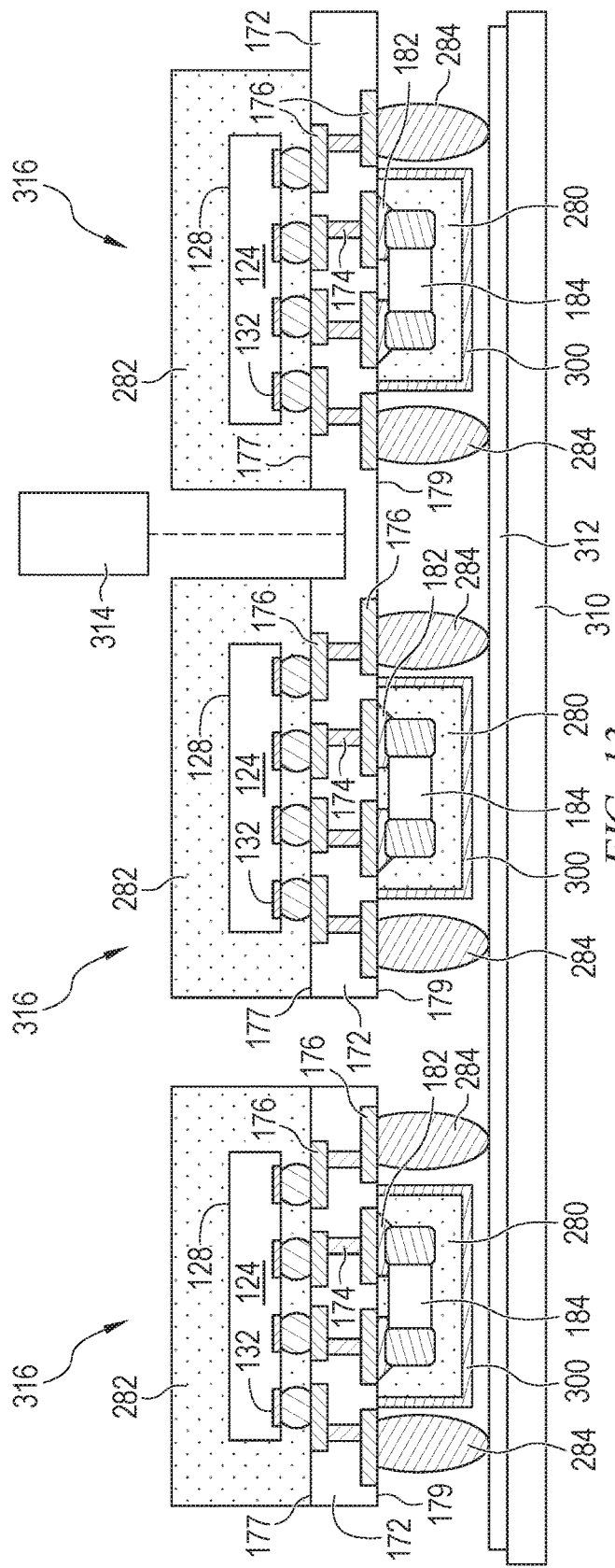

In FIG. 13e, panel 278 is flipped over and disposed on carrier 310 with top surface 179 of substrate 170 oriented away from the carrier. Saw blade or laser cutting tool 314 is used to fully singulate each SIP package 316 from each other. Singulation in FIG. 13e exposes all side surfaces of top encapsulant portion 282. Generally, rectangular devices are formed, so top encapsulant portion 282 has four sides, but any number and shape of sides can be used as with lower encapsulant portion 280. Adhesive or interface layer 312 keeps devices 316 in place after singulation for subsequent processing.

In FIG. 13f, top shielding layer 320 is formed over top encapsulant portion 282 in a similar manner as bottom shielding layer 300. Top shielding layer 320 extends over the top and side surfaces of top encapsulant portion 282 to provide electromagnetic shielding for semiconductor die 124 and other components disposed on top surface 179 of substrate 170. Together, top shielding layer 320 and bottom shielding layer 300 provide comprehensive electromagnetic shielding for SIP packages 316.

FIG. 14 illustrates a SIP package 326 formed as shown in FIGS. 13a-13f, but with another possible component configuration. SIP package 326 is manufactured using a simple and economical process flow for double-sided molding in a single molding step, while also providing electromagnetic shielding for components on both sides of the device.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate including an opening formed through the substrate;
   disposing the substrate in a mold; and
   depositing an encapsulant into the mold, wherein the encapsulant flows through the opening.

2. The method of claim 1, further including:
   disposing an interconnect structure on the substrate;
   depositing the encapsulant over the interconnect structure; and
   backgrinding the encapsulant to expose the interconnect structure.

3. The method of claim 1, further including:
   disposing a leadframe over the substrate, wherein the leadframe includes a base and a plurality of conductive pillars disposed between the base and the substrate;
   depositing the encapsulant between the leadframe and substrate; and
   removing the base to leave the conductive pillars exposed from the encapsulant.

4. The method of claim 1, further including singulating the substrate after depositing the encapsulant, wherein the opening is removed.

5. The method of claim 1, further including:
   disposing the substrate in the mold with a portion of the mold contacting a portion of a first surface of the substrate;
   removing the substrate and encapsulant from the mold;
   disposing a mask over the portion of the first surface of the substrate;
   forming a first shielding layer over the mask and first surface of the substrate; and
   removing the mask and a portion of the first shielding layer.

6. The method of claim 5, further including:
   singulating the substrate and encapsulant; and
   forming a second shielding layer over the encapsulant opposite the first shielding layer after singulating.

7. A method of making a semiconductor device, comprising:
   providing a substrate including a plurality of device regions; and
   forming a first opening through the substrate outside a footprint of the device regions, wherein the substrate remains extending completely around the first opening.

8. The method of claim 7, wherein the first opening includes a length greater than a combined length of a plurality of the device regions.

9. The method of claim 7, further including forming the first opening at an edge of the substrate.

10. The method of claim 9, further including forming a second opening between two of the plurality of device regions.

11. The method of claim 7, further including forming the first opening between two of the plurality of device regions.

12. The method of claim 7, further including disposing a first electronic component on a first surface of the substrate within a first device region of the plurality of device regions.

13. The method of claim 12, further including disposing a second electronic component on a second surface of the substrate within the first device region of the plurality of device regions.

14. A semiconductor device, comprising:
   a substrate including a plurality of device regions; and
   a first opening formed through the substrate near an edge of the substrate, wherein the substrate extends completely around the first opening.

15. The semiconductor device of claim 14, wherein the device regions are organized into a plurality of columns and the first opening extends across each of the plurality of columns.

16. The semiconductor device of claim 14, further including a plurality of first openings formed at the edge of the substrate.

17. The semiconductor device of claim 14, further including a second opening formed between two of the plurality of device regions.

18. The semiconductor device of claim 14, further including a first electronic component disposed on a first surface of the substrate within a first device region of the plurality of device regions.

19. The semiconductor device of claim 18, further including a second electronic component disposed on a second surface of the substrate within the first device region of the plurality of device regions.

20. A semiconductor device, comprising:
   a substrate including a plurality of device regions; and
   an opening formed through the substrate outside a footprint of the device regions, wherein the substrate extends completely around the first opening.

21. The semiconductor device of claim 20, wherein the device regions are organized into a plurality of columns and the opening extends across each of the plurality of columns.

22. The semiconductor device of claim 20, wherein the opening is formed at an edge of the substrate.

23. The semiconductor device of claim 20, wherein the opening is formed between two of the plurality of device regions.

24. The semiconductor device of claim 20, further including a first electronic component disposed on a first surface of the substrate within a first device region of the plurality of device regions.

25. The semiconductor device of claim 24, further including a second electronic component disposed on a second surface of the substrate within the first device region of the plurality of device regions.

* * * * *